US012765081B2

(12) United States Patent
Yang et al.

(10) Patent No.: US 12,765,081 B2
(45) Date of Patent: Oct. 13, 2026

(54) METHOD OF FABRICATING SEMICONDUCTOR DEVICE

(71) Applicant: WUHAN XINXIN SEMICONDUCTOR MANUFACTURING CO., LTD., Wuhan (CN)

(72) Inventors: Fan Yang, Wuhan (CN); Sheng Hu, Wuhan (CN)

(73) Assignee: WUHAN XINXIN SEMICONDUCTOR MANUFACTURING CO., LTD., Hubei (CN)

( * ) Notice: Subject to any disclaimer, the term of this patent is extended or adjusted under 35 U.S.C. 154(b) by 551 days.

(21) Appl. No.: 18/365,759

(22) Filed: Aug. 4, 2023

(65) Prior Publication Data

US 2023/0378233 A1 Nov. 23, 2023

Related U.S. Application Data

(63) Continuation of application No. 16/976,829, filed as application No. PCT/CN2019/125961 on Dec. 17, 2019, now Pat. No. 11,791,367.

(30) Foreign Application Priority Data

Dec. 2, 2019 (CN) ........................ 201911216003.8

(51) Int. Cl.
*H10F 39/00* (2025.01)
*H10F 39/12* (2025.01)

(52) U.S. Cl.
CPC ......... *H10F 39/026* (2025.01); *H10F 39/199* (2025.01); *H10F 39/807* (2025.01); *H10F 39/811* (2025.01)

(58) Field of Classification Search
CPC .... H10F 39/026; H10F 39/811; H10F 39/807; H10F 39/199
See application file for complete search history.

(56) References Cited

U.S. PATENT DOCUMENTS 7,492,027 B2 2/2009 Mouli
9,647,016 B2 5/2017 Oh
(Continued)

FOREIGN PATENT DOCUMENTS

CN 104078414 A 10/2014
CN 104637968 A 5/2015
(Continued)

*Primary Examiner* — Mounir S Amer
*Assistant Examiner* — Alexander Belousov
(74) *Attorney, Agent, or Firm* — MUNCY, GEISSLER, OLDS & LOWE, P.C.

(57) ABSTRACT

A method of fabricating of semiconductor device is disclosed. The method of fabricating semiconductor device includes: forming a trench fill structure in a substrate in a pixel area; covering a buffer dielectric layer over a surface of the substrate in the pixel area, the buffer dielectric layer burying the trench fill structure; etching the buffer dielectric layer to form a first opening, which at least exposes a portion of the substrate surrounding a top surface of the trench fill structure; and forming a metal grid layer on the buffer dielectric layer, wherein the metal grid layer fills the first opening to at least directly contact with and electrically connect to the exposed portion of the substrate. The present invention provides a technical solution that brings the metal grid layer into electrical connection with the exposed portion of the substrate, thus allowing optimization or amelioration of the semiconductor device's electrical performance.

15 Claims, 13 Drawing Sheets

(56) References Cited

U.S. PATENT DOCUMENTS

| | | | | |
|---|---|---|---|---|
| 10,515,988 | B2 | 12/2019 | Tayanaka | |
| 10,784,303 | B2 | 9/2020 | Chen | |
| 11,217,547 | B2 | 1/2022 | Chou | |
| 11,264,423 | B2 | 3/2022 | Watanabe | |
| 11,362,126 | B2 | 6/2022 | Ogita | |
| 2005/0184353 | A1 | 8/2005 | Mouli | |
| 2006/0038252 | A1 | 2/2006 | Mouli | |
| 2008/0217724 | A1 | 9/2008 | Uya | |
| 2017/0207270 | A1 | 7/2017 | Chen | |
| 2021/0066225 | A1* | 3/2021 | Chou | H10F 39/807 |

FOREIGN PATENT DOCUMENTS

| | | | |
|---|---|---|---|
| CN | 106601758 | A | 4/2017 |
| CN | 106981495 | A | 7/2017 |
| CN | 108511476 | A | 9/2018 |
| CN | 208819867 | U | 5/2019 |
| CN | 106601758 | B | 6/2020 |
| CN | 108511476 | B | 1/2021 |

* cited by examiner

METHOD OF FABRICATING SEMICONDUCTOR DEVICE

CROSS-REFERENCE TO RELATED APPLICATIONS

This application is a continuation of U.S. patent application Ser. No. 16/976,829, filed Aug. 31, 2020, which in turn claims the priority to Chinese patent application number 201911216003.8, filed on Dec. 2, 2019, the entire contents of which are incorporated herein by reference for all purposes.

TECHNICAL FIELD

The present invention relates to the fabrication of semiconductor integrated circuits, in particular, to a method of fabricating such a semiconductor device.

BACKGROUND

In the manufacturing process of a back-illuminated CMOS image sensor (BSI-CIS), the deep-trench isolation (DTI) technique, when used in combination with the formation of a backside metal grid (BMG), makes the back-illuminated CMOS image sensor have improved optical performance.

However, in back-illuminated CMOS image sensors fabricated using existing processes, such a metal grid is formed in a pixel area and separated from an underlying substrate and deep-trench fill structures by a buffer dielectric layer, which only allows the metal grid to be physically connected, but not electrically connected, to the underlying substrate and deep-trench fill structures, making it impossible to optimize or ameliorate electrical performance of the back-illuminated CMOS image sensors.

Therefore, there is an urgent need for improving the fabrication process of the metal grid formed in the pixel area, which allows the metal grid to be electrically connected to the underlying substrate and/or trench fill structures and thus enable optimization or amelioration of the semiconductor device's electrical performance.

SUMMARY OF THE INVENTION

It is an objective of the present invention to provide methods of fabricating a semiconductor device, allowing optimization or amelioration of the semiconductor device's electrical performance.

To this end, the present invention provides a method of fabricating a semiconductor device, the method including:

- providing a substrate defining a pixel area;
- forming a trench fill structure in the substrate in the pixel area;
- covering a buffer dielectric layer over a surface of the substrate in the pixel area, the buffer dielectric layer burying the trench fill structure;
- etching the buffer dielectric layer to form a first opening, which exposes at least a portion of the substrate surrounding sidewalls of a top of the trench fill structure and/or at least a portion of the top of the trench fill structure; and
- forming a metal grid layer on the buffer dielectric layer, wherein the metal grid layer fills the first opening and is electrically connected to the exposed portion of the substrate and/or the exposed portion of the trench fill structure.

Optionally, forming a trench fill structure in the substrate in the pixel area may include:

- covering a pad oxide layer over the surface of the substrate in the pixel area;
- forming a first patterned photoresist layer on the pad oxide layer and etching the pad oxide layer and at least a partial thickness of the substrate with the first patterned photoresist layer serving as a mask, thereby forming a trench in the substrate in the pixel area;
- removing the first patterned photoresist layer;
- forming an isolation oxide layer over a surface of the trench and a surface of the pad oxide layer;
- completely filling the trench with a filler material, which also covers the isolation oxide layer outside the trench; and
- removing a portion of the filler material, the isolation oxide layer and the pad oxide layer on the surface of the substrate outside the trench by performing an etching or chemical mechanical polishing (CMP) process, thereby forming the trench fill structure in the trench.

Optionally, the filler material may include a first conductive metal layer, wherein the first opening exposing at least a portion of a top of the trench fill structure includes: the first opening surrounding sidewalls of the top of the trench fill structure and exposing the first conductive metal layer on the sidewalls of the top of the trench fill structure in the first opening; and/or, the first opening being located on a top surface of the trench fill structure and exposing an entire or a portion of a top surface of the first conductive metal layer of the trench fill structure in the first opening.

Optionally, etching the buffer dielectric layer to form a first opening may include:

- forming a second patterned photoresist layer on the buffer dielectric layer and etching the buffer dielectric layer with the second patterned photoresist layer serving as a mask, thereby forming the first opening in the buffer dielectric layer above the pixel area, the first opening exposing at least a portion of the substrate surrounding the sidewalls of the top of the trench fill structure and/or at least a portion of the top of the trench fill structure; and
- removing the second patterned photoresist layer.

Optionally, forming the metal grid layer on the buffer dielectric layer includes:

- forming a second conductive metal layer to cover the buffer dielectric layer, the second conductive metal layer completely filling the first opening;
- forming a third patterned photoresist layer on the second conductive metal layer and etching the second conductive metal layer with the third patterned photoresist layer serving as a mask, thereby forming the metal grid layer above the pixel area, the metal grid layer electrically connected to the portion of the substrate and/or the portion of the trench fill structure exposed in the first opening; and
- removing the third patterned photoresist layer.

Optionally, the substrate may further define a pad area lateral to the pixel area, wherein a metal interconnect structure and a plug structure above the metal interconnect structure are formed in the substrate in the pad area, the plug structure electrically connected at a bottom thereof to the metal interconnect structure.

Optionally, the trench fill structure includes a first conductive metal layer in a trench formed in the pixel area, and the plug structure in the substrate in the pad area is formed simultaneously with the trench fill structure in the substrate in the pixel area.

Optionally, the buffer dielectric layer covering the surface of the substrate in the pixel area further covers a surface of the substrate in the pad area so that the buffer dielectric layer also buries the plug structure, wherein forming the first opening by etching the buffer dielectric layer above the pixel area is performed simultaneously with etch the buffer dielectric layer above the pad area to form a second opening in which a top surface of the plug structure is partially exposed; and wherein forming the metal grid layer on the buffer dielectric layer in the pixel area is performed simultaneously with forming a pad structure on the buffer dielectric layer in the pad area, the pad structure completely filling the second opening so as to be electrically connected to the exposed portion of the top surface of the plug structure.

Optionally, the metal grid layer is in electrical connected to the exposed portion of the substrate to apply a bias voltage to a backside of the substrate.

The present invention also provides another method of fabricating a semiconductor device, the method including:

- providing a substrate defining a pixel area;
- forming a trench fill structure in the substrate in the pixel area;
- covering a buffer dielectric layer over a surface of the substrate in the pixel area, the buffer dielectric layer burying the trench fill structure;
- etching the buffer dielectric layer to form a first opening, which at least exposes a portion of the substrate surrounding the trench fill structure; and
- forming a metal grid layer on the buffer dielectric layer, wherein the metal grid layer fills the first opening to at least directly contact with and electrically connect to the exposed portion of the substrate.

The present invention provides the following advantages over the prior art:

It provides a method of fabricating a semiconductor device, in which a trench fill structure is formed in a substrate in a pixel area, and a surface of the substrate in the pixel area is covered with a buffer dielectric layer so that the buffer dielectric layer buries the trench fill structure beneath. The buffer dielectric layer is etched to form a first opening in which at least a portion of the substrate surrounding a top edge of the trench fill structure and/or at least part of a top of the trench fill structure is/are exposed. A metal grid layer is formed on the buffer dielectric layer so that it fills the first opening and is electrically connected to the exposed portion (s) of the substrate and/or the trench fill structure. This allows optimization or amelioration of the semiconductor device's electrical performance.

BRIEF DESCRIPTION OF THE DRAWINGS

In FIGS. 1*a* to 7*i*,

10—substrate; 11—pixel area; 111—trench; 112—trench fill structure; 1121—first isolation oxide layer; 1122—conductive metal layer; 12—pad area; 121—metal interconnect structure; 122—trench; 123—second isolation oxide layer; 124—opening; 125—pad structure; 13—pad oxide layer; 14—first patterned photoresist layer; 15—buffer dielectric layer; 16—metal grid layer; 161—metal grid film; 17—second patterned photoresist layer; 18—dielectric layer;

20—substrate; 21—pixel area; 211—trench; 212—trench fill structure; 2121—isolation oxide layer; 2122—first conductive metal layer; 2131, 2132, 2133—first opening; 214, 215, 216, 217—metal grid layer; 22—pad area; 221—metal interconnect structure; 222—through-hole; 223—plug structure; 2231—isolation oxide layer; 2232—first conductive metal layer; 224—second opening; 225—pad structure; 23—pad oxide layer; 24—first patterned photoresist layer; 25—buffer dielectric layer; 261, 262, 263—second patterned photoresist layer; 27—second conductive metal layer; 281, 282, 283—third patterned photoresist layer.

DETAILED DESCRIPTION

The fabrication of a metal grid layer in a pixel area and a pad structure in a pad area will be described below.

Figure 1A:
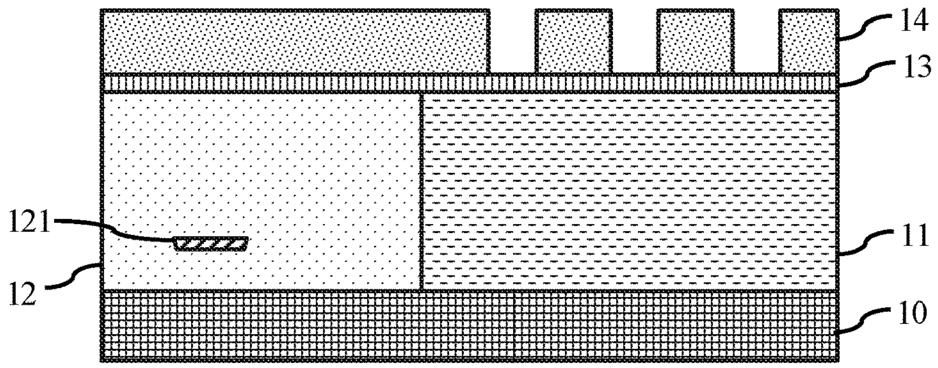
FIGS. 1*a* to 1*j* are schematic illustrations of a semiconductor device being fabricated by a method.

As shown in FIG. 1*a*, a substrate 10 defining the pixel area 11 and the pad area 12 is provided, and a metal interconnect structure 121 is formed within the pad area 12.

Figure 1B:
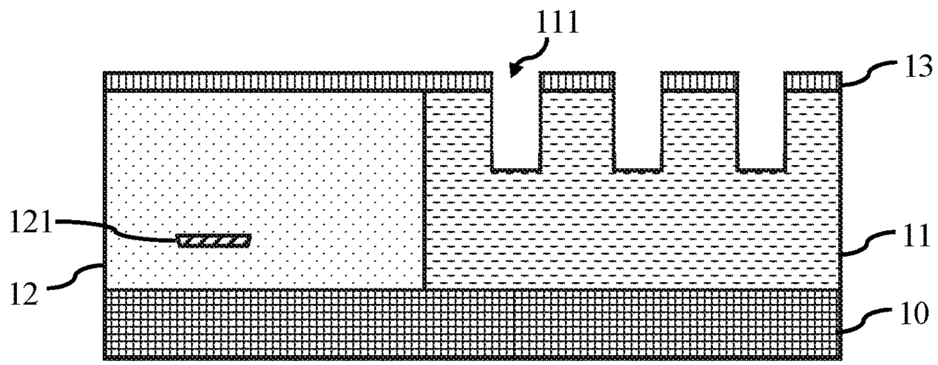

As shown in FIGS. 1*a* and 1*b*, a pad oxide layer 13 is formed over the substrate 10, and a first patterned photoresist layer 14 is formed on the pad oxide layer 13. A trench 111 is formed in the pixel area 11 by etching the pad oxide layer 13 above the pixel area 11 and at least a partial thickness of the substrate 10 with the first patterned photoresist layer 14 serving as a mark, and the first patterned photoresist layer 14 is then removed.

Figure 1C:
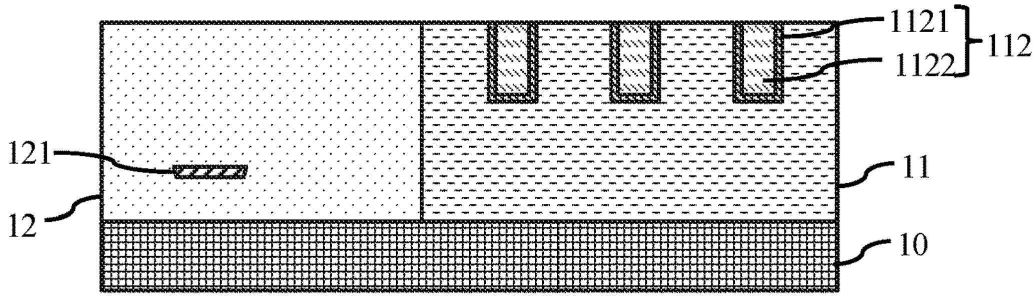

As shown in FIG. 1*c*, a first isolation oxide layer 1121 is formed on the surface of the trench 111 and the surface of the substrate 10, and a conductive metal layer 1122 is filled in the trench 111 and the conductive metal layer 1122 extends over the substrate 10. A chemical mechanical polishing process may be then performed to remove the portions of the conductive metal layer 1122, first isolation oxide layer 1121 and pad oxide layer 13 above the substrate 10, resulting in the formation of a trench fill structure 112 in the trench 111.

Figure 1D:
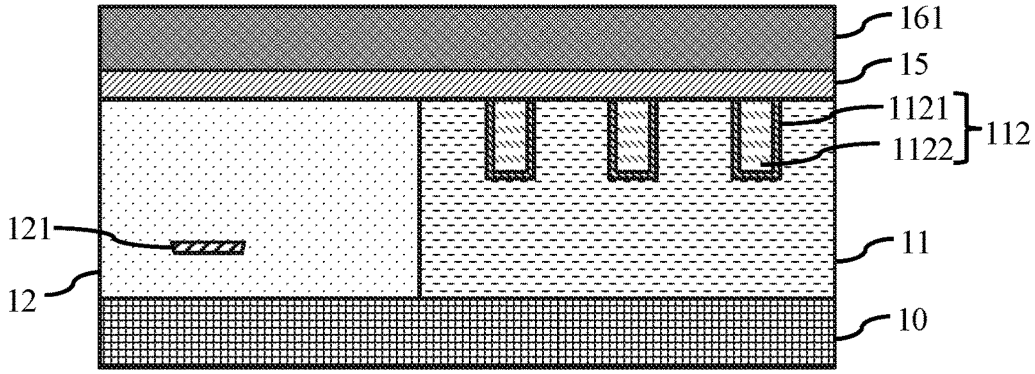

As shown in FIG. 1*d*, a buffer dielectric layer 15 and a metal grid film 161 are sequentially formed over the substrate 10.

Figure 1E:
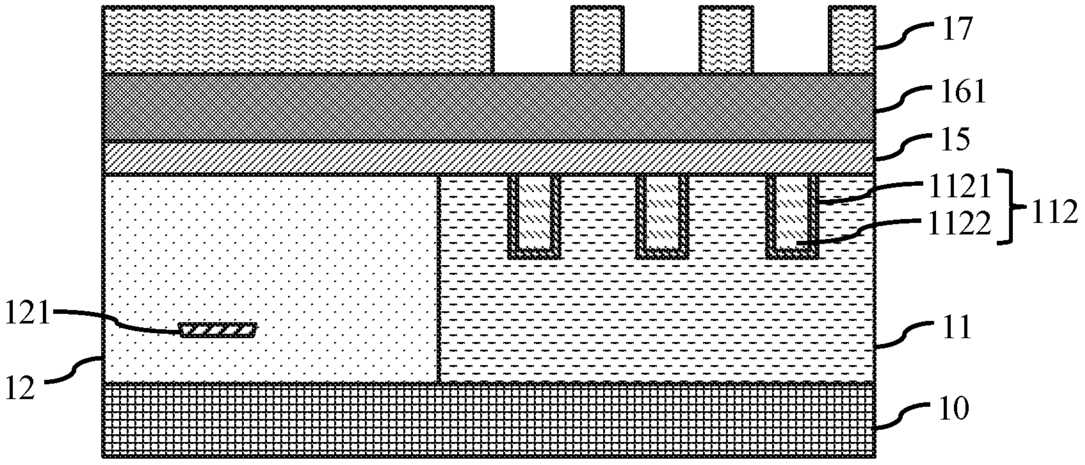
Figure 1F:
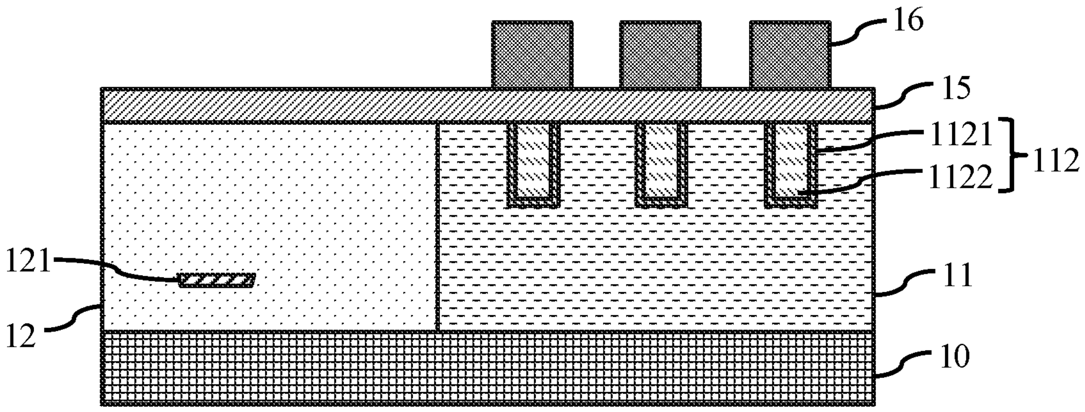

As shown in FIGS. 1*e* and 1*f*, a second patterned photoresist layer 17 is formed on the metal grid film 161, and the metal grid film 161 is etched with the second patterned photoresist layer 17 serving as a mask so that a metal grid layer 16 is formed on the buffer dielectric layer 15 above the pixel area 11, followed by removal of the second patterned photoresist layer 17. The metal grid layer 16 above the pixel area 11 is located in correspondence with the underlying trench fill structure 112.

Figure 1G:
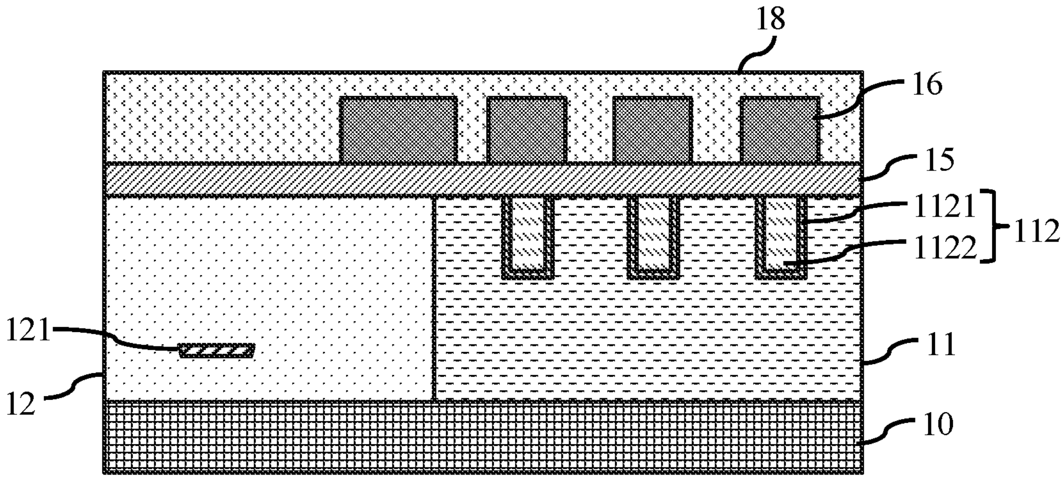

As shown in FIG. 1*g*, a dielectric layer 18 is formed over the buffer dielectric layer 15 and the dielectric layer 18 buries the metal grid layer 16.

Figure 1H:
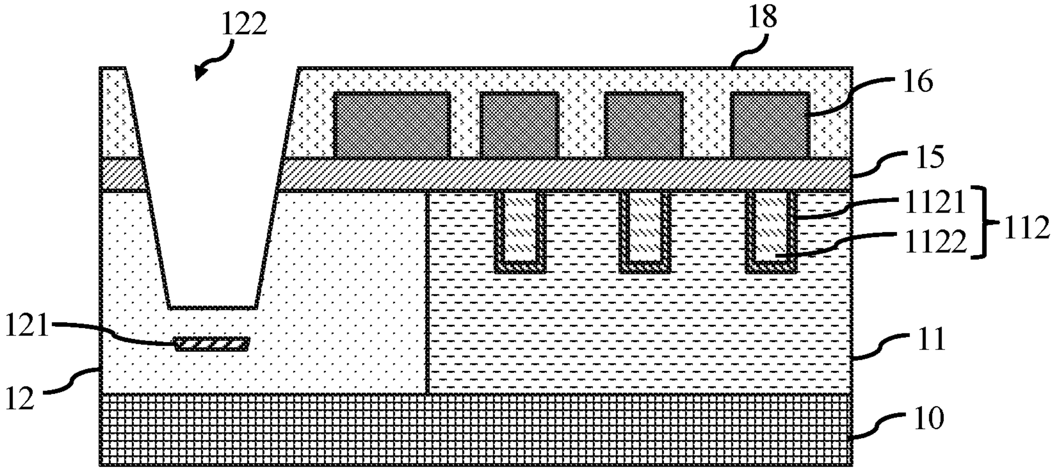

As shown in FIG. 1*h*, a trench 122 is formed in the pad area 12 above the metal interconnect structure 121 over the substrate 10.

Figure 1I:
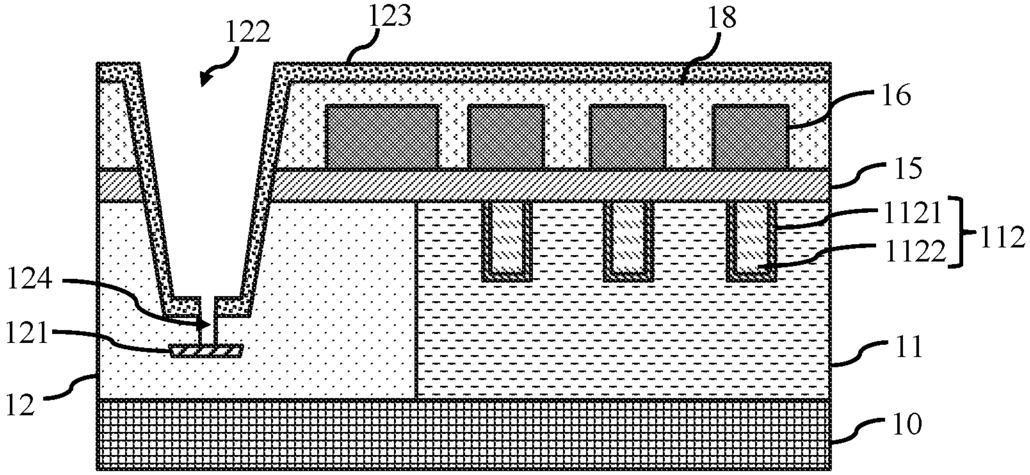

As shown in FIG. 1*i*, a second isolation oxide layer 123 is formed over surfaces of the trench 122 and the second isolation oxide layer 123 buries the dielectric layer 18. An opening 124 is then formed at the bottom of the trench 122 so that part of a top surface of the metal interconnect structure 121 is exposed in the opening 124.

Figure 1J:
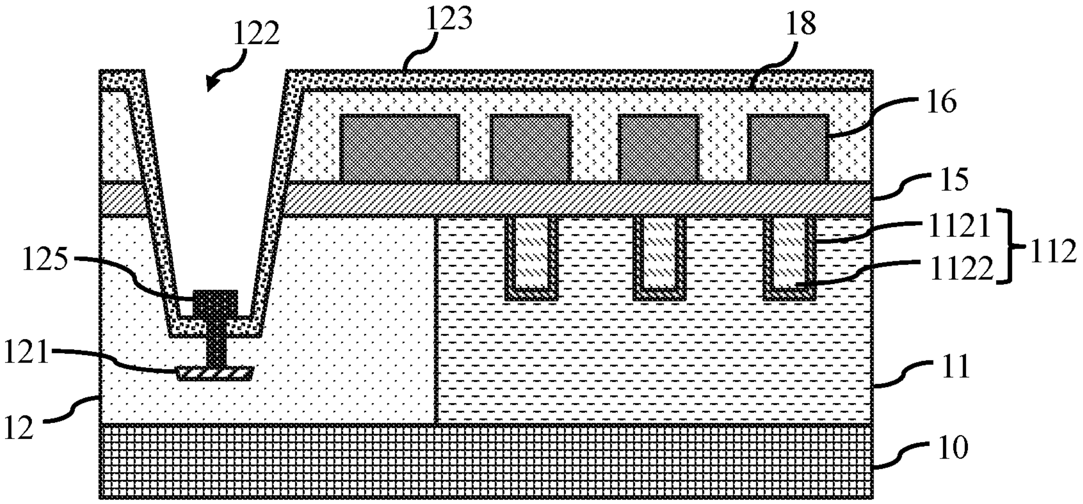

As shown in FIG. 1*j*, a metallic material is filled in both the opening 124 and the trench 122, and the metallic material within the trench 122 is etched, so that a pad structure 125 is formed, which extends through the opening 124 and partially resides on the bottom of the trench 122. The pad structure 125 is electrically connected at the bottom to the metal interconnect structure 121.

It is apparent from the description of the above steps that the buffer dielectric layer interposing the metal grid layer above the pixel area and the underlying substrate and trench fill structure allows the metal grid layer to be physically connected to, but not electrically connected to, the underlying substrate and trench fill structure, making it impossible to optimize or ameliorate the semiconductor device's electrical performance. In order to overcome this, the present invention proposes a semiconductor device and a method of fabricating such a device, in which a metal grid layer is brought into electrical connection to an underlying substrate and/or trench fill structure, thus allowing optimization or amelioration of the semiconductor device's electrical performance.

The above objects, features and advantages of the present invention will become apparent upon reading the following more detailed description of the proposed semiconductor device and method with reference to FIGS. 2 to 7*i*. Note that the accompanying drawings are provided in a very simplified form not necessarily presented to scale, with their only intention to facilitate convenience and clarity in explaining the embodiments.

Figure 2:
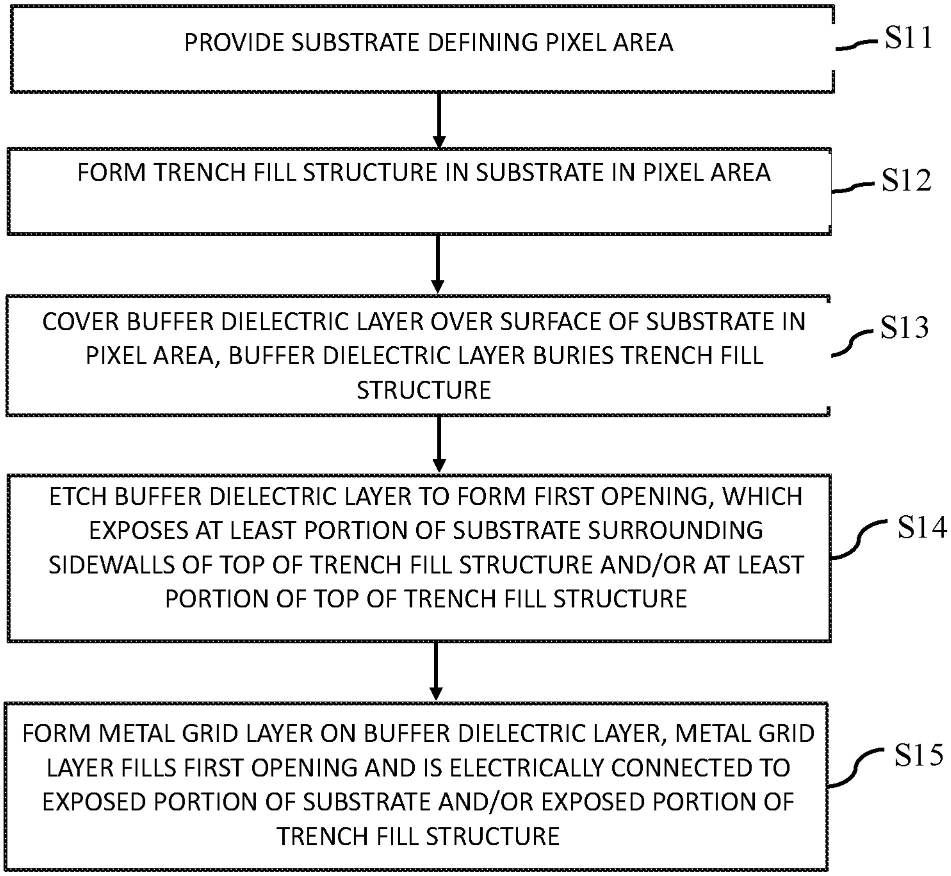
FIG. 2 is a flowchart of a method for fabricating a semiconductor device according to embodiments of the present invention.

An embodiment of the present invention provides a method of fabricating a semiconductor device. Referring to FIG. 2, FIG. 2 is a flowchart of a method of fabricating a semiconductor device according to one embodiment of the present invention. The method of fabricating a semiconductor device includes the steps of:

S11) providing a substrate defining a pixel area;

S12) forming a trench fill structure in the substrate in the pixel area;

S13) covering a surface of the substrate in the pixel area with a buffer dielectric layer so that the buffer dielectric layer buries the trench fill structure;

S14) forming a first opening by etching the buffer dielectric layer so that at least a portion of the substrate outside a top edge of the trench fill structure and/or at least part of a top of the trench fill structure is/are exposed in the first opening; and S15) forming a metal grid layer over the buffer dielectric layer, which fills the first opening so as to be electrically connected to the exposed portion of the substrate and/or of the trench fill structure.

The method of fabricating a semiconductor device according to this embodiment will be described in greater detail below with reference to FIGS. 3*a* to 7*i*, which show schematic longitudinal cross-sectional views of the semiconductor device being fabricated.

In step S11, a substrate 20 defining a pixel area 21 is provided. The substrate 20 may be made of any suitable material well known to those skilled in the art. For example, it may be formed of at least one of: silicon (Si), germanium (Ge), silicon germanium (SiGe), silicon carbide (SiC), silicon-germanium-carbon (SiGeC), indium arsenide (InAs), gallium arsenide (GaAs), indium phosphide (InP) or other III/V compound semiconductors.

Figure 3A:
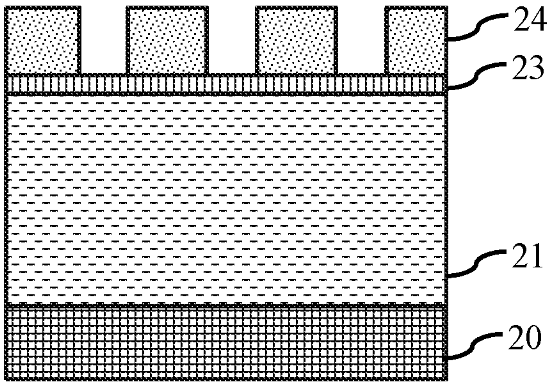
FIGS. 3*a* to 3*i* schematically illustrate the semiconductor device fabricated in accordance with a first embodiment of the method of FIG. 2.
Figure 3B:
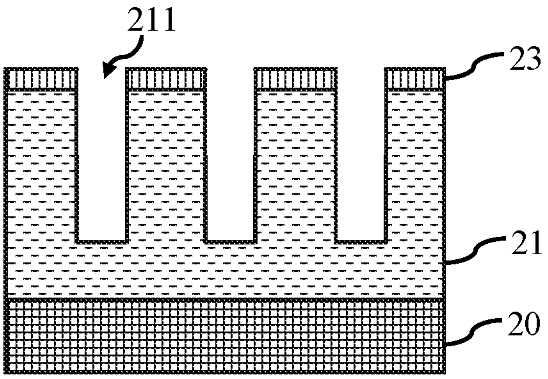
Figure 3C:
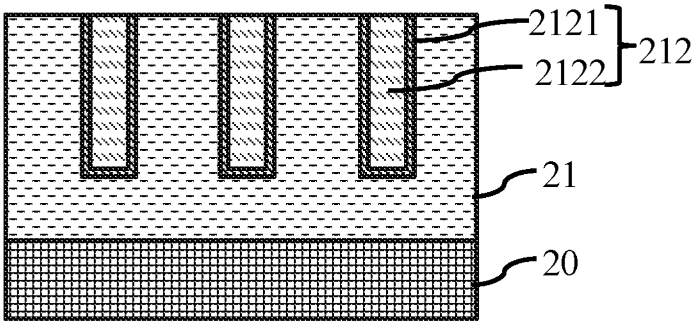

Referring to FIGS. 3*a* to 3*c*, in step S12, a trench fill structure 212 is formed in the substrate 20 within the pixel area 21. The formation of the trench fill structure 212 in the substrate 20 within the pixel area 21 may include the steps of: as shown in FIG. 3*a*, first covering a surface of the substrate 20 in the pixel area 21 with a pad oxide layer 23, the pad oxide layer 23 configured to protect the surface of the substrate 20 during the subsequent formed of a first patterned photoresist layer 24 by photolithography; as shown in FIGS. 3*a* and 3*b*, then forming the first patterned photoresist layer 24 on the pad oxide layer 23 and etching the pad oxide layer 23 and at least a partial thickness of the substrate 20, with the first patterned photoresist layer 24 serving as a mask, so that a trench 211 is formed in the substrate 20 in the pixel area 21; subsequently, as shown in FIG. 3*b*, removing the first patterned photoresist layer 24 and then forming an isolation oxide layer 2121 on surfaces of the trench 211 and the pad oxide layer 23, wherein the isolation oxide layer 2121 in the trench 211 may cover either only the trench 211's side surface or both the trench 211's side and bottom surfaces; afterward, filling the trench 211 with a filler material, which also covers the isolation oxide layer 2121 outside the trench 211; and after that, removing the filler material, isolation oxide layer 2121 and pad oxide layer 23 over the surface of the substrate 20 outside the trench 211 by performing an etching or chemical mechanical polishing (CMP) process, resulting in the formation of the trench fill structure 212 in the trench 211, as shown in FIG. 3*c*. The trench 211 may be a deep trench with a thickness ranging from 1 μm to 5 μm. It is to be noted that the trench 211 is not limited to the given range and the trench 211 may have any suitable depth as required by the intended performance of the semiconductor device.

The filler material may include a dielectric material, or a metallic material, or both. In case of the filler material being implemented as a metallic material, as shown in FIG. 3*c*, the trench fill structure 212 includes the isolation oxide layer 2121 covering the surface of the trench 211 and a first conductive metal layer 2122 filling the remaining space in the trench 211 (i.e., the filler material forms the first conductive metal layer 2122). The dielectric material may include at least one of silicon dioxide, silicon nitride, tetraethyl orthosilicate, borosilicate glass, phosphorosilicate glass, borophosphosilicate glass and silicon oxynitride, and the metallic material may include at least one of tungsten, nickel, aluminum, silver, gold and titanium.

In addition, a top surface of the trench fill structure 212 may be flush with a top surface of the substrate 20 or a top surface of the trench fill structure 212 may be higher than a top surface of the substrate 20. Alternatively, in the trench fill structure 212, only a top surface of the filler material may be higher than the top surface of the substrate 20.

Figure 3D:
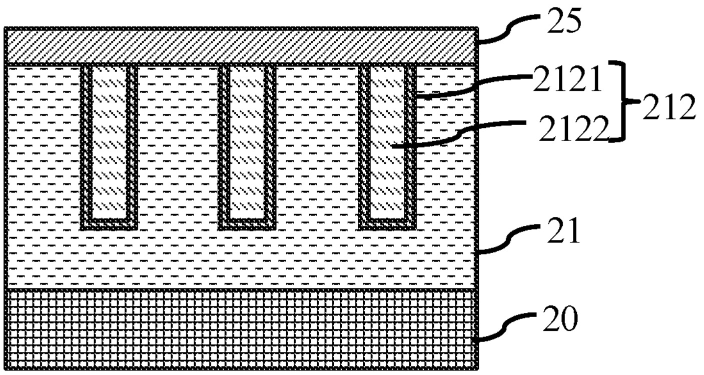

Referring to FIG. 3*d*, in step S13, the surface of the substrate 20 in the pixel area 21 is covered with a buffer dielectric layer 25, and the buffer dielectric layer 25 buries the trench fill structure 212. The buffer dielectric layer 25 may be formed of a material including at least one of silicon dioxide, silicon nitride, tetraethyl orthosilicate, borosilicate glass, phosphorosilicate glass, borophosphosilicate glass and silicon oxynitride.

Referring to FIGS. 3*e* to 3*f*, 4*a* to 4*b* and 5*a* to 5*b*, in step S14, a first opening is formed by etching the buffer dielectric layer 25. In the first opening, at least a portion of the substrate 20 surrounding a top edge of the trench fill structure 212 or at least part of a top of the trench fill structure 212 is exposed, alternatively, both of the at least a portion of the substrate 20 surrounding a top edge of the trench fill structure 212 and at least part of a top of the trench fill structure 212 are exposed.

Here, exposing at least a portion of the substrate 20 surrounding the top edge of the trench fill structure 212 in the first opening means that a sidewall of the first opening surrounds at least the top edge of the trench fill structure 212 so that a portion of the substrate 20 surrounding the top edge of the trench fill structure 212 is exposed in the first opening.

Example scenarios of exposing at least part of the top of the trench fill structure 212 in the first opening may include: in case of the top surface of the trench fill structure 212 being higher than the top surface of the substrate 20, with the sidewall of the first opening so surrounding the protruding upper portion of the trench fill structure 212 that the isolation oxide layer 2121 is exposed at a sidewall of the protruding upper portion, also exposing a portion of the substrate 20 surrounding the sidewall of the protruding upper portion in the first opening; in case of only the top surface of the filler material in the trench fill structure 212 being higher than the top surface of the substrate 20, with the sidewall of the first opening surrounding the protruding upper portion of the trench fill structure 212, exposing the filler material at a sidewall of the protruding upper portion in the first opening; in case of the top surface of the trench fill structure 212 higher than or flush with the top surface of the substrate 20, with the first opening being seated on the top surface of the trench fill structure 212, exposing the entire or part of the top surface of the trench fill structure 212 in the first opening, including exposing the entire or part of the top surface of the filler material and/or the entire or part of a top surface of the isolation oxide layer 2121 in the first opening; and in case of the top surface of the trench fill structure 212 higher than the top surface of the substrate 20, exposing both the isolation oxide layer 2121 or filler material at the sidewall of the protruding upper portion of the trench fill structure 212 and the entire or part of the top surface of the trench fill structure 212 in the first opening.

When the filler material includes the first conductive metal layer 2122, example scenarios of exposing at least part of the top of the trench fill structure 212 in the first opening may include: with the sidewall of the first opening surrounding the top edge of the trench fill structure 212, exposing the first conductive metal layer 2122 at the sidewall of the protruding upper portion of the trench fill structure 212 in the first opening; with the first opening being seated on the top surface of the trench fill structure 212, alternatively, exposing the entire or part of a top surface of the first conductive metal layer 2122 in the trench fill structure 212 in the first opening; alternatively, exposing both the first conductive metal layer 2122 at the sidewall of the protruding upper portion of the trench fill structure 212 and the entire or part of the top surface of the first conductive metal layer 2122 in the trench fill structure 212 in the first opening.

Examples of forming the first opening in which various underlying components can be exposed are given below.

Figure 3E:
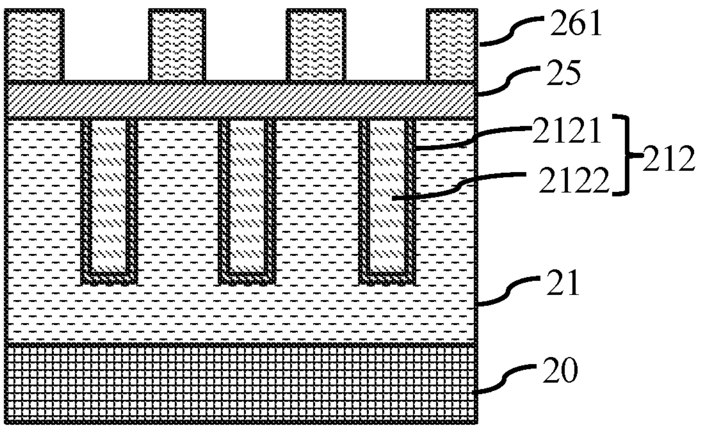
Figure 3F:
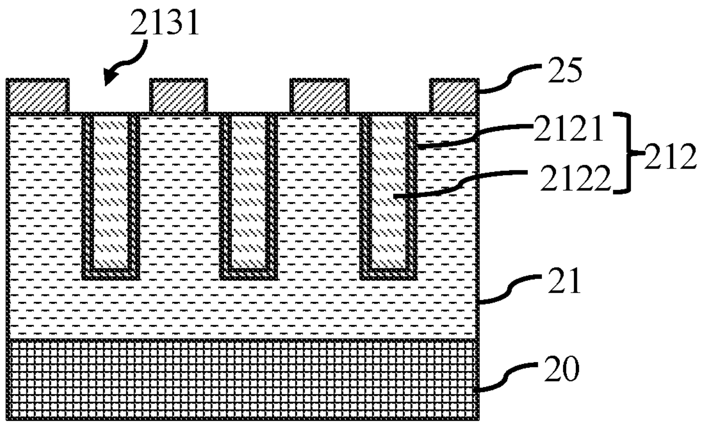

Referring to FIGS. 3*e* to 3*f*, the formation of the first opening 2131 may include the steps of: forming a second patterned photoresist layer 261 on the buffer dielectric layer 25 (see FIG. 3*e*); and etching the buffer dielectric layer 25 with the second patterned photoresist layer 261 serving as a mask so that the first opening 2131 is formed in the buffer dielectric layer 25 above the pixel area 21, both a portion of the substrate 20 surrounding the top edge of the trench fill structure 212 and the entire top surface of the trench fill structure 212 are exposed in the first opening 2131, as shown in FIG. 3*f*.

Figure 4A:
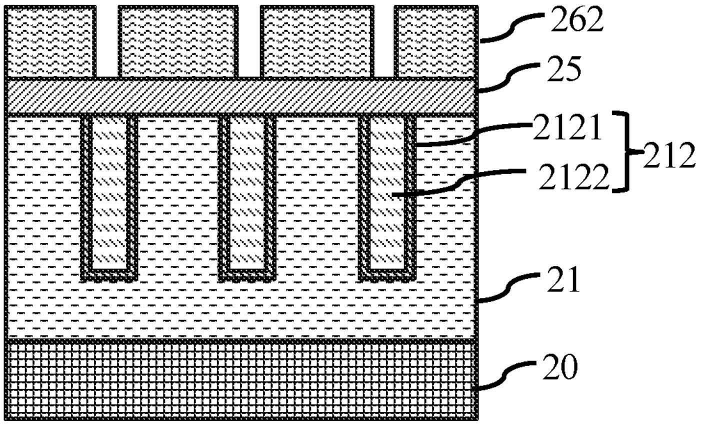
FIGS. 4*a* to 4*e* schematically illustrate the semiconductor device fabricated in accordance with a second embodiment of the method of FIG. 2.
Figure 4B:
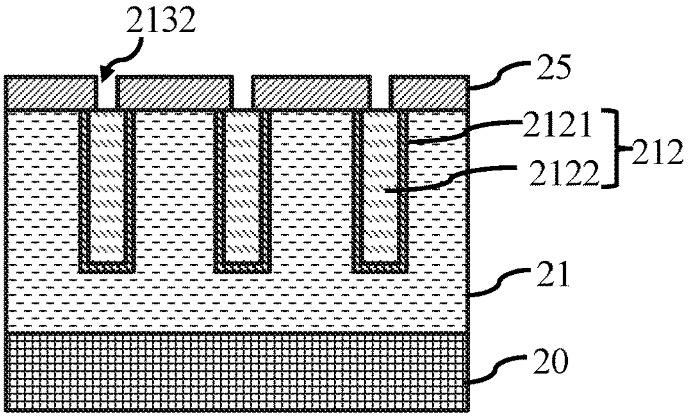

Alternatively, referring to FIGS. 4*a* to 4*b*, the formation of the first opening 2132 may include the steps of: forming a second patterned photoresist layer 262 on the buffer dielectric layer 25 (see FIG. 4*a*); and etching the buffer dielectric layer 25 with the second patterned photoresist layer 262 serving as a mask so that the first opening 2132 is formed in the buffer dielectric layer 25 above the pixel area 21, part of the top surface of the trench fill structure 212, e.g., part of the top surface of the filler material therein, is exposed in the first opening 2131, as shown in FIG. 4*b*. In this case, if the filler material is the first conductive metal layer 2122, then part of the top surface of the first conductive metal layer 2122 in the trench fill structure 212 is exposed in the first opening 2132.

Figure 5A:
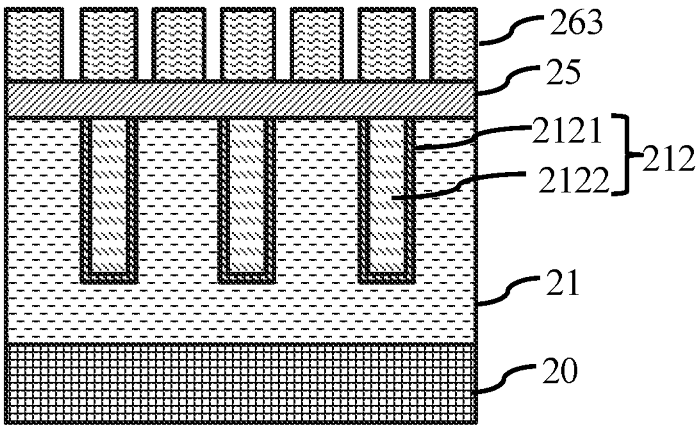
FIGS. 5*a* to 5*e* schematically illustrate the semiconductor device fabricated in accordance with a third embodiment of the method of FIG. 2.
Figure 5B:
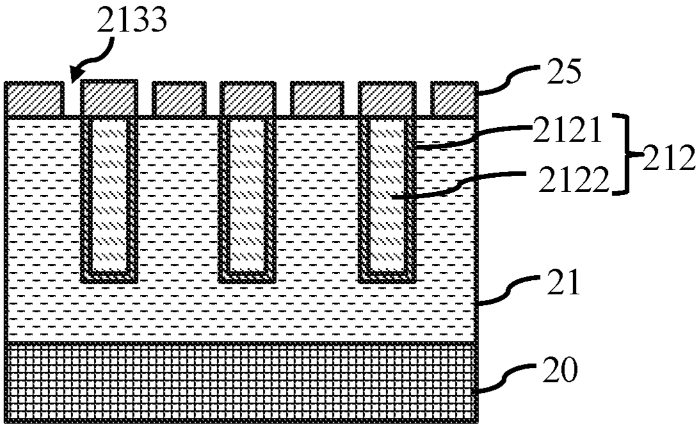

Alternatively, referring to FIGS. 5*a* to 5*b*, the formation of the first opening 2133 may include the steps of: forming a second patterned photoresist layer 263 on the buffer dielectric layer 25 (see FIG. 5*a*); and etching the buffer dielectric layer 25 with the second patterned photoresist layer 263 serving as a mask so that the first opening 2133 is formed in the buffer dielectric layer 25 above the pixel area 21, a portion of the substrate 20 surrounding the top edge of the trench fill structure 212 is exposed in the first opening 2131, as shown in 5*b*.

The second patterned photoresist layer may be removed after the first opening has been formed.

Referring to FIGS. 3*g* to 3*i*, 4*c* to 4*e*, 5*c* to 5*e* and 6, in step S15, a metal grid layer is formed over the buffer dielectric layer 25, the metal grid layer fills the first opening so as to be electrically connected to either the exposed portions of the substrate 20 or of the trench fill structure 212 or to be electrically connected to both of the exposed portions of the substrate 20 and of the trench fill structure 212. Electrically connecting the metal grid layer to the exposed portion(s) of the substrate 20 and/or trench fill structure 212 allows optimization or amelioration of the semiconductor device's electrical performance, such as its dark current performance.

When only the substrate 20 is partially exposed in the first opening, the metal grid layer is electrically connected to only the exposed portion of the substrate 20. When the top of the trench fill structure 212 is at least partially exposed in the first opening, the various example scenarios described above in connection with step S14 may correspond to electrically connecting the metal grid layer respectively to the underlying: exposed portion of the substrate 20, when the top surface of the trench fill structure 212 is higher than the top surface of the substrate 20, with the sidewall of the first opening surrounding the protruding upper portion of the trench fill structure 212 (so that the isolation oxide layer 2121 is exposed at the sidewall of the protruding upper portion); first conductive metal layer 2122 exposed at the sidewall of the protruding upper portion of the trench fill structure 212, when only the top surface of the filler material in the trench fill structure 212, which is implemented as the first conductive metal layer 2122, is higher than the top surface of the substrate 20, with the sidewall of the first opening surrounding the protruding upper portion of the trench fill structure 212; entirely or partially exposed top surface of the first conductive metal layer 2122 in the trench fill structure 212, when the top surface of the trench fill structure 212 is higher than or flush with the top surface of the substrate 20, with the first opening being seated on the top surface of the filler material in the trench fill structure 212, which is implemented as the first conductive metal layer 2122; and both portion of the substrate 20 and first conductive metal layer 2122, when the top surface of the trench fill structure 212 is higher than the top surface of the substrate 20, with both the isolation oxide layer 2121 or first conductive metal layer 2122 at the sidewall of the protruding upper portion of the trench fill structure 212 and the entire or part of the top surface of the first conductive metal layer 2122 being exposed in the first opening.

Depending on what is exposed in the first opening in step S14 and on how the first opening is formed, forming the metal grid layer over the buffer dielectric layer 25 may include the different sets of steps as detailed below.

Figure 3G:
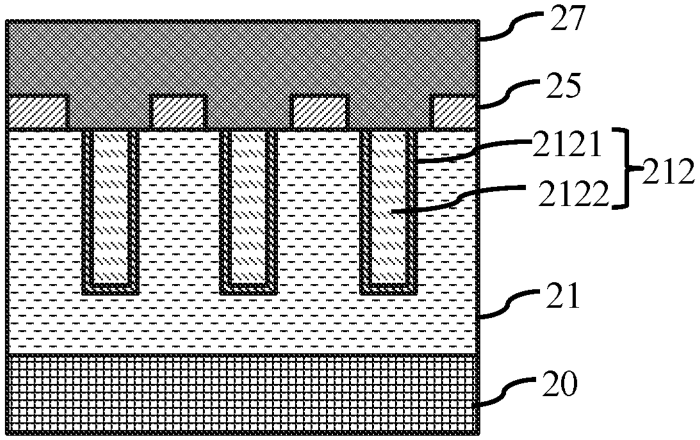
Figure 3H:
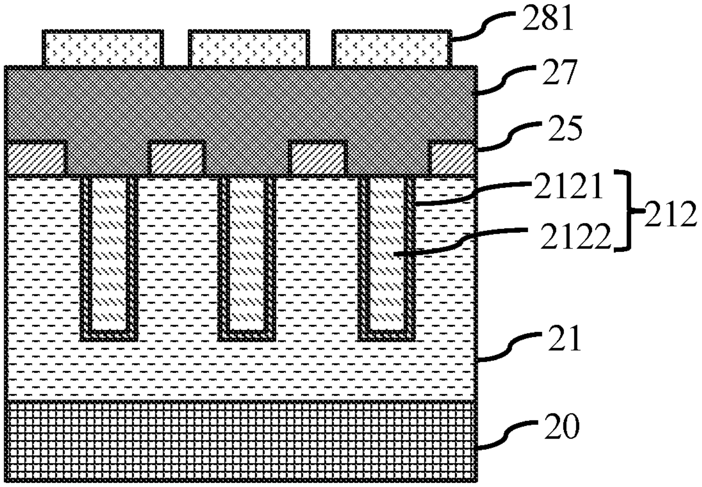
Figure 3I:
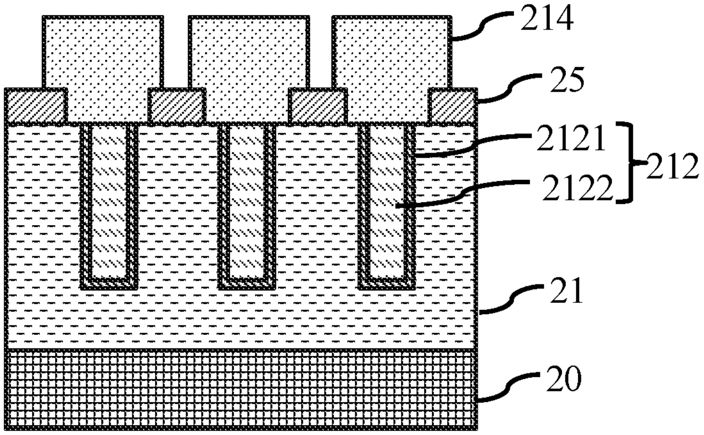

Referring to FIGS. 3*g* to 3*i*, the formation of the metal grid layer 214 over the buffer dielectric layer 25 may include the steps of: as shown in FIG. 3*g*, a second conductive metal layer 27 is formed to cover the buffer dielectric layer 25 and the second conductive metal layer 27 fills the first opening 2131; and then forming a third patterned photoresist layer 281 on the second conductive metal layer 27 (as shown in FIG. 3*h*) and etching the second conductive metal layer 27 with the third patterned photoresist layer 281 serving as a mask, resulting in the formation of the metal grid layer 214 above the pixel area 21 (as shown in FIG. 3*i*), the metal grid layer 214 is electrically connected to both a portion of the substrate 20 surrounding the top edge of the trench fill structure 212 and the entire top surface of the trench fill structure 212 that are both exposed in the first opening 2131.

Figure 4C:
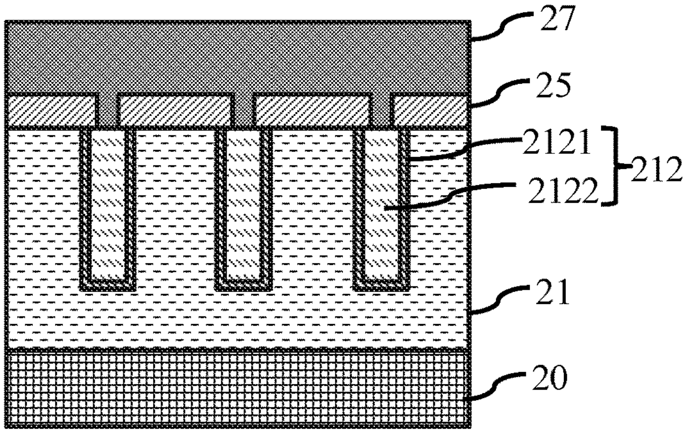
Figure 4D:
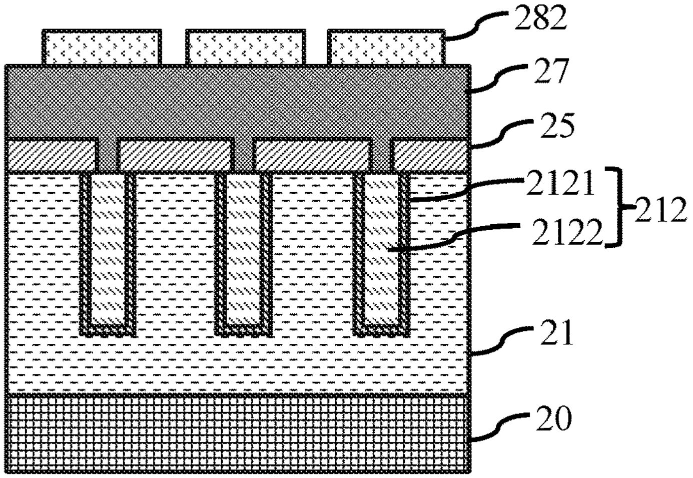
Figure 4E:
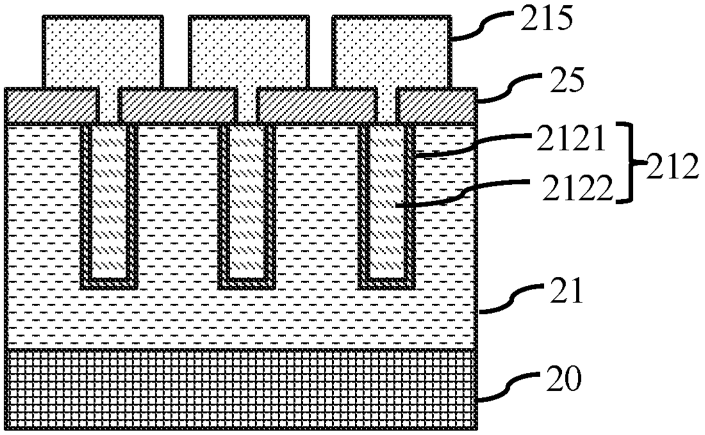

Alternatively, referring to FIGS. 4*c* to 4*e*, the formation of the metal grid layer 214 over the buffer dielectric layer 25 may include the steps of: as shown in FIG. 4*c*, a second conductive metal layer 27 is formed to cover the buffer dielectric layer 25 and the second conductive metal layer 27 fills the first opening 2132; and then forming a third patterned photoresist layer 282 on the second conductive metal layer 27 (as shown in FIG. 4*d*) and etching the second conductive metal layer 27 with the third patterned photoresist layer 282 serving as a mask, resulting in the formation of the metal grid layer 215 above the pixel area 21 (as shown in FIG. 4*e*), the metal grid layer 215 is electrically connected to part of the top surface of the first conductive metal layer 2122 in the trench fill structure 212 exposed in the first opening 2132.

Figure 5C:
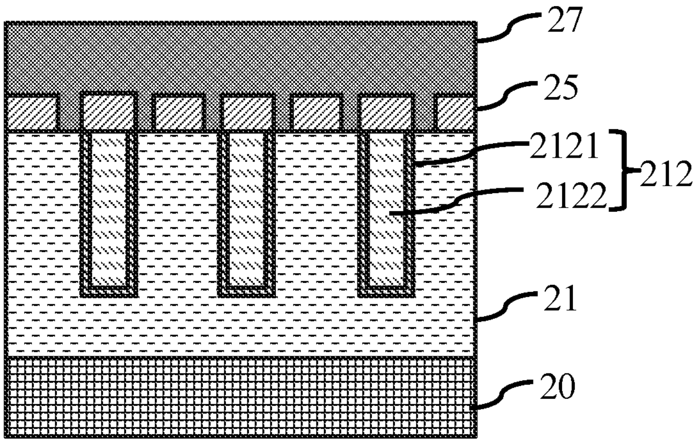
Figure 5D:
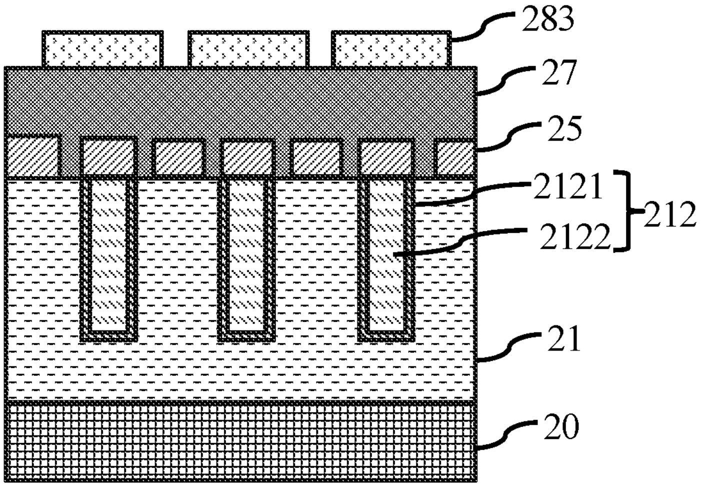
Figure 5E:
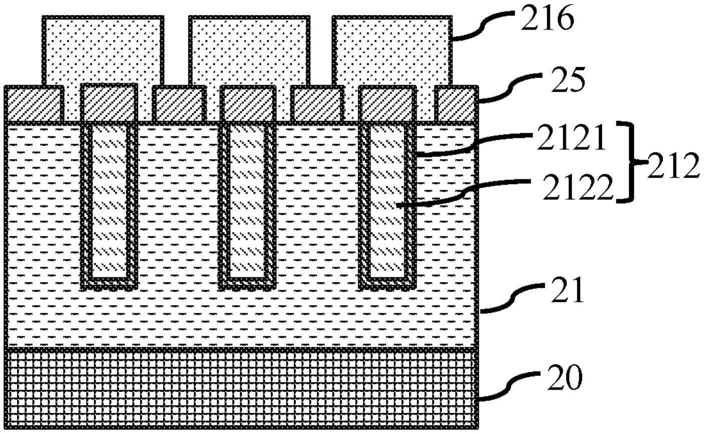

Alternatively, referring to FIGS. 5*c* to 5*e*, the formation of the metal grid layer 216 over the buffer dielectric layer 25 may include the steps of: as shown in FIG. 5*c*, a second conductive metal layer 27 is formed to cover the buffer dielectric layer 25 and the second conductive metal layer 27 fills the first opening 2133; and then forming a third patterned photoresist layer 283 on the second conductive metal layer 27 (as shown in FIG. 5*d*) and etching the second conductive metal layer 27 with the third patterned photoresist layer 283 serving as a mask, resulting in the formation of the metal grid layer 216 above the pixel area 21 (as shown in FIG. 5*e*), the metal grid layer 216 is electrically connected to a portion of the substrate 20 that surrounds the top edge of the trench fill structure 212 and is exposed in the first opening 2133.

The third patterned photoresist layer may be removed after the metal grid layer has been formed. The second conductive metal layer 27 may be formed of a material including at least one of nickel, aluminum, silver, gold, titanium and copper.

Figure 6:
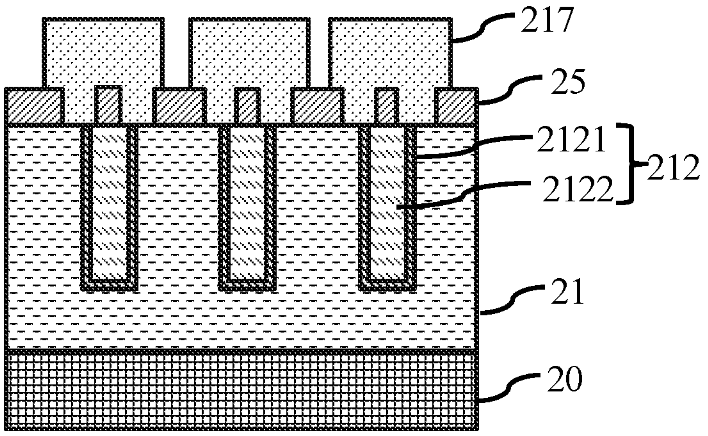
FIG. 6 schematically illustrates the semiconductor device fabricated in accordance with a fourth embodiment of the method of FIG. 2.

Alternatively, as shown in FIG. 6, the metal grid layer 217 may be electrically connected to both a portion of the substrate 20 surrounding the top edge of the trench fill structure 212 and part of the top surface of the first conductive metal layer 2122 in the trench fill structure 212 that are both exposed in the first opening.

The substrate may further define a pad area located laterally to the pixel area, in which there are formed a metal interconnect structure and a plug structure above the metal interconnect structure. The plug structure may be electrically connected at the bottom to the metal interconnect structure and at the top to an overlying pad structure. It is to be noted that, than the metal interconnect structure, any other suitable metal structure electrically connected to the bottom of the plug structure may be formed in the substrate in the pad area. For example, such a metal structure may be a conductive contact plug electrically connected the bottom of the plug structure. The following description will be given in the context of the metal structure being implemented as a metal interconnect structure.

Since the plug structure contains a metallic material, the trench fill structure in the pixel area must be separately fabricated from the plug structure in the pad area if the filler material in the trench fill structure is a dielectric material. Otherwise, if the filler material in the trench fill structure is a metallic material, the trench fill structure in the pixel area may be fabricated either separately from or simultaneously with the plug structure in the pad area.

When the trench fill structure in the pixel area is fabricated separately from the plug structure in the pad area, the metallic material in the plug structure may be a conductive metal layer different from the first conductive metal layer in the trench fill structure. When the trench fill structure in the pixel area is fabricated simultaneously with the plug structure in the pad area, the metallic material in the plug structure will be provided by the first conductive metal layer in the trench fill structure.

Since the plug structure is electrically connected at the bottom to the metal interconnect structure, if there is another isolation oxide layer in the plug structure, this isolation oxide layer can only cover a sidewall of a through-hole in which part of a top surface of the metal interconnect structure is exposed. When the isolation oxide layer in the plug structure is made of the same material as the isolation oxide layer in the trench fill structure and the latter covers only the side surface of the trench in the pixel area, the trench fill structure in the pixel area may be fabricated simultaneously with the plug structure in the pad area. When the isolation oxide layer in the plug structure is made of the same material as the isolation oxide layer in the trench fill structure and the latter covers both the side and bottom surfaces of the trench in the pixel area, simultaneous fabrication of the trench fill structure in the pixel area and the plug structure in the pad area requires additional step of removing a further isolation oxide layer on a bottom surface of the through-hole. When the isolation oxide layer in the plug structure is made of a different material from the isolation oxide layer in the trench fill structure, the trench fill structure in the pixel area must be separately fabricated from the plug structure in the pad area.

When the trench fill structure in the pixel area can be fabricated simultaneously with the plug structure in the pad area, the metal grid layer in the pixel area and the pad structure in the pad area can also be fabricated simultaneously.

As can be seen from the process described above in connection with FIGS. 1*a* to 1*j*, fabricating the metal grid layer in the pixel area and the pad structure in the pad area in separate steps can lead to high process complexity and low process integration and thus to high process cost. Therefore, fabricating the trench fill structure and metal grid layer in the pixel area simultaneously with the plug structure and pad structure in the pad area can lower process complexity and increase process integration, thus resulting in a reduction in process cost.

Reference will be made to FIGS. 7*a* to 7*i* to explain how the trench fill structure and the metal grid layer in the pixel area are fabricated simultaneously with the plug structure and the pad structure in the pad area. For details in the different scenarios of electrical connection of the metal grid layer in the pixel area with the exposed portion(s) of the substrate and/or the trench fill structure, please refer to the above steps S11 to S15, and a repeated description thereof will be omitted. Taking the metal grid layer 214 being electrically connected to both a portion of the substrate 20 surrounding the top edge of the trench fill structure 212 and the entire top surface of the trench fill structure 212 that are both exposed in the first opening 2131, shown in FIGS. 7*a* to 7*i*, as an example, the following description will be given in the context of the trench fill structure 212 and the metal grid layer 214 in the pixel area 21 being fabricated simultaneously with the plug structure 223 and the pad structure 225 in the pad area 22.

Figure 7A:
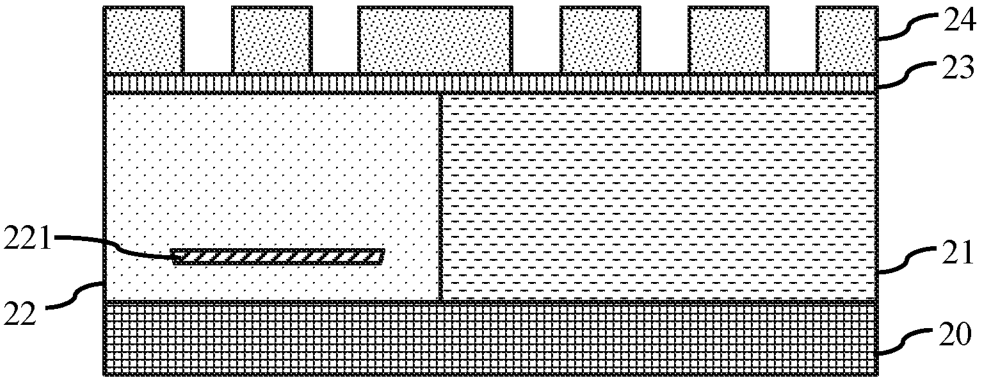
FIGS. 7*a* to 7*i* schematically illustrate the semiconductor device fabricated in accordance with a fifth embodiment of the method of FIG. 2.

Referring to FIG. 7*a*, in step S21, a substrate 20 defining a pixel area 21 and a pad area 22 is provided. The pad area 22 is located laterally to the pixel area 21. A metal interconnect structure 221 is formed in the substrate 20 in the pad area 22.

Figure 7B:
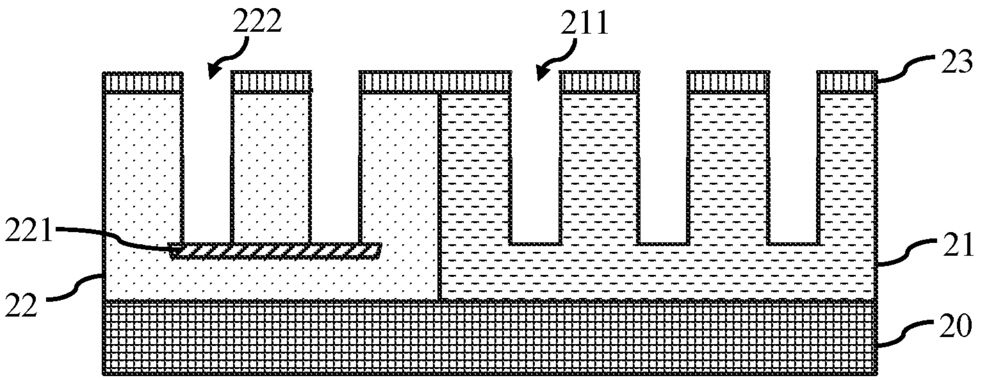
Figure 7C:
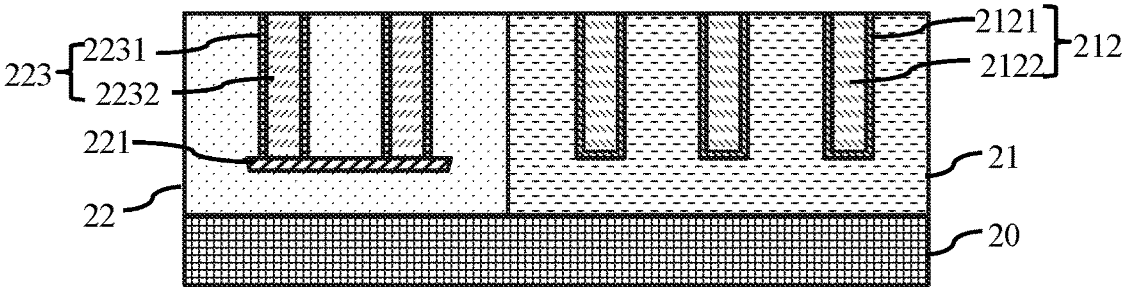

Referring to FIGS. 7*a* to 7*c*, in step S22, a trench fill structure 212 and a plug structure 223 are simultaneously formed in the substrate 20 in the pixel area 21 and the pad area 22, respectively. The formation may include the steps of: as shown in FIG. 7*a*, first covering a surface of the substrate 20 in both the pixel and pad areas 21, 22 with a pad oxide layer 23, the pad oxide layer 23 configured for protecting the surface of the substrate 20 during the subsequent formation of a first patterned photoresist layer 24 by photolithography; as shown in FIGS. 7*a* and 7*b*, then forming the first patterned photoresist layer 24 on the pad oxide layer 23 and etching the pad oxide layer 23 and at least a partial thickness of the substrate 20 with the first patterned photoresist layer 24 serving as a mask, thereby forming a trench 211 in the substrate 20 in the pixel area 21 and a through-hole 222 in the substrate 20 in the pad area 22, the through-hole 222 exposing part of a top surface of the metal interconnect structure 221, the trench 211 having a depth equal to that of the through-hole 222; subsequently, as shown in FIG. 7*b*, removing the first patterned photoresist layer 24; afterward, forming an isolation oxide layer on surfaces of the trench 211, the through-hole 222 and the pad oxide layer 23 (in order to facilitate the explanation of the subsequent steps, the isolation oxide layer portion in the trench 211 is referred to as the "isolation oxide layer 2121" and that in the through-hole 222 as the "isolation oxide layer 2231" hereinafter, and these portions are indicated by different filling patterns in FIG. 7*c*), the isolation oxide layer 2121 in the trench 211 covering either only the trench 211's side surface or both the trench 211's side and bottom surfaces, the isolation oxide layer 2231 in the through-hole 222 covering only the through-hole 222's sidewall; after that, forming a first conductive metal layer, which fills both the trench 211 and the through-hole 222 (in order to facilitate the explanation of the subsequent steps, the first conductive metal layer portion in the trench 211 is referred to as the "first conductive metal layer 2122" and that in the through-hole 222 as the "first conductive metal layer 2232", and these portions are indicated by different filling patterns in FIG. 7*c*) and covers the isolation oxide layer outside the trench 211 and the through-hole 222; and then removing the first conductive metal layer, isolation oxide layer and pad oxide layer 23 over the surface of the substrate 20 outside the trench 211 and the through-hole 222 by performing an etching or CMP process, resulting in the formation of the trench fill structure 212 in the trench 211 and the plug structure 223 in the through-hole 222, as shown in FIG. 7*c*. The first conductive metal layer 2232 in the plug structure 223 is electrically connected at the bottom to the metal interconnect structure 221.

Figure 7D:
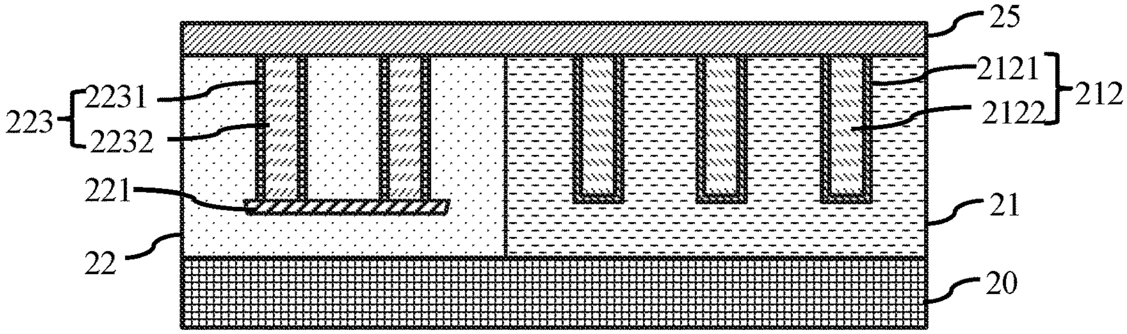

Referring to FIG. 7*d*, in step S23, the surface of the substrate 20 in the pixel and pad areas 21, 22 are covered with a buffer dielectric layer 25 so that the buffer dielectric layer 25 buries the trench fill structure 212 and the plug structure 223.

Figure 7E:
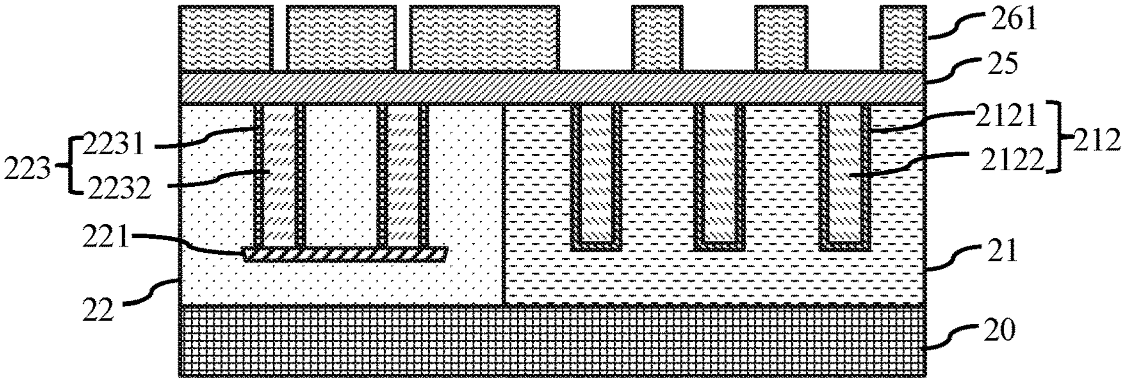
Figure 7F:
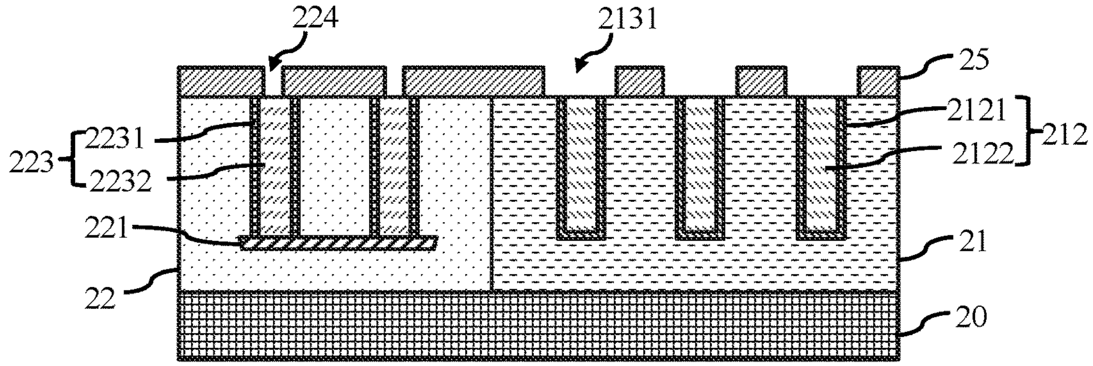

Referring to FIGS. 7*e* to 7*f*, in step S24, the buffer dielectric layer 25 is etched to form a first opening 2131 in the buffer dielectric layer 25 above the pixel area 21 and a second opening 224 in the buffer dielectric layer 25 above the pad area 22. Both a portion of the substrate 20 surrounding a top edge of the trench fill structure 212 and the entire top surface of the trench fill structure 212 are exposed in the first opening 2131, while part of a top surface of the plug structure 223 is exposed in the second opening 224.

The formation of the first and second openings 2131, 224 may include the steps of: forming a second patterned photoresist layer 261 on the buffer dielectric layer 25 (as shown in FIG. 7*e*); and etching the buffer dielectric layer 25, with the second patterned photoresist layer 261 as a mask, thereby resulting in the formation of the first opening 2131 in the buffer dielectric layer 25 above the pixel area 21 and the second opening 224 in the buffer dielectric layer 25 above the pad area 22, as shown in FIG. 7*f*. Both a portion of the substrate 20 surrounding the top edge of the trench fill structure 212 and the entire top surface of the trench fill structure 212 are exposed in the first opening 2131, while the entire or part of a top surface of the first conductive metal layer 2232 in the plug structure 223 is exposed in the second opening 224.

Figure 7G:
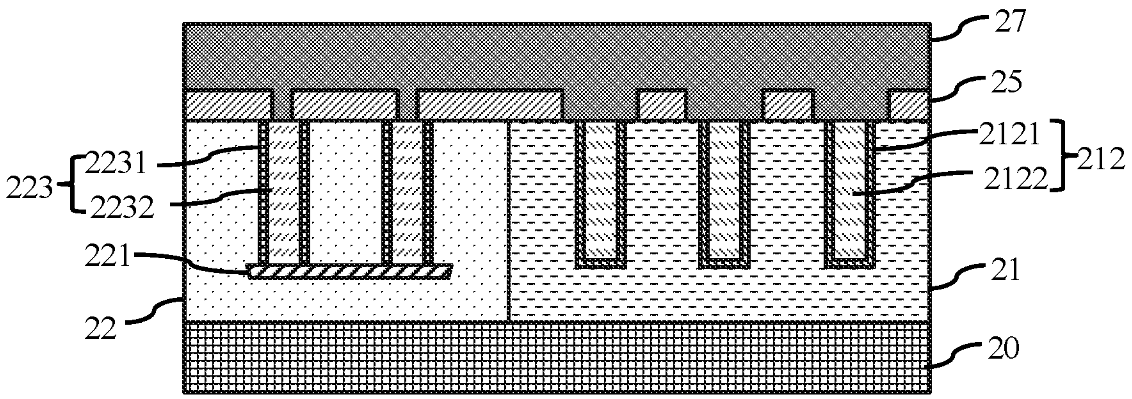
Figure 7H:
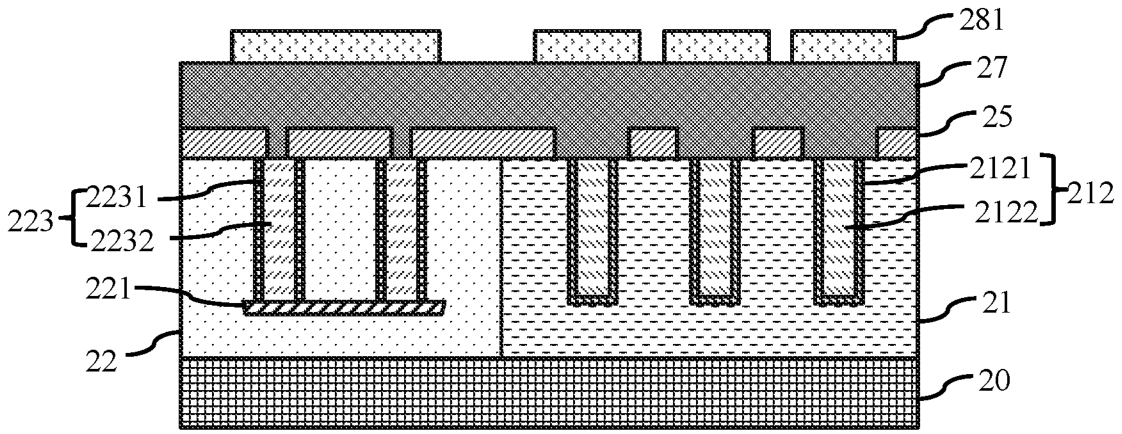
Figure 7I:
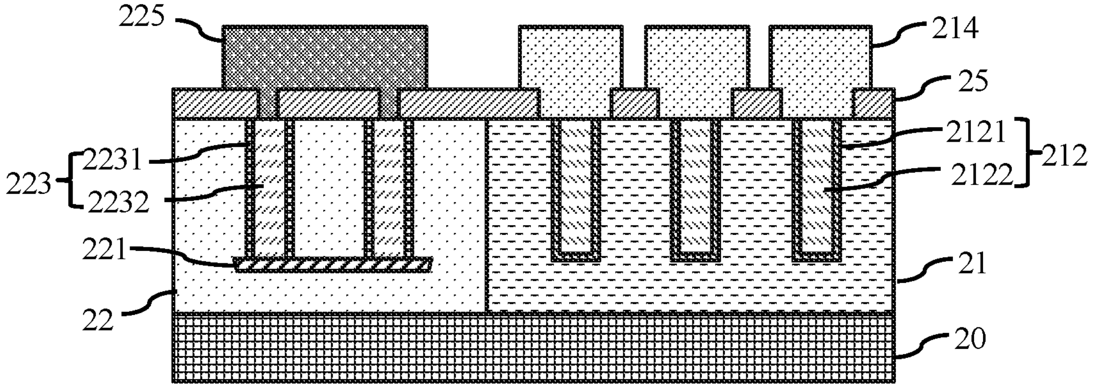

Referring to FIGS. 7*g* to 7*i*, in step S25, the metal grid layer 214 and the pad structure 225 are simultaneously formed in the buffer dielectric layer 25 above the pixel area 21 and the pad area 22, respectively. The metal grid layer 214 fills the first opening 2131 so as to be electrically connected to the exposed portions of the substrate 20 and the trench fill structure 212. The pad structure 225 fills the second opening 224 so as to be electrically connected to the exposed top portion of the plug structure 223.

The simultaneous formation of the metal grid layer 214 and the pad structure 225 in the buffer dielectric layer 25 above the pixel area 21 and the pad area 22, respectively, may include the steps of: as shown in FIG. 7*g*, first forming a second conductive metal layer 27 on the buffer dielectric layer 25, which fills both the first and second openings 2131, 224; and then forming a third patterned photoresist layer 281 on the second conductive metal layer 27 (as shown in FIG. 7*h*) and etching the second conductive metal layer 27 with the third patterned photoresist layer 281 serving as a mask, resulting in the formation of the metal grid layer 214 above the pixel area 21 and the pad structure 225 above the pad area 22 (as shown in FIG. 7*i*). The metal grid layer 214 is electrically connected to both the portion of the substrate 20 surrounding the top edge of the trench fill structure 212 and the entire top surface of the trench fill structure 212 that are both exposed in the first opening 2131. The pad structure 225 is electrically connected to the entirely or partially exposed top surface of the first conductive metal layer 2232 in the plug structure 223.

The various steps in the method are not limited to the above-described order in which they are carried out. Rather, the order of these steps can be adapted as necessary.

In summary, the present invention provides a method for fabricating a semiconductor device, the method including: providing a substrate defining a pixel area; forming a trench fill structure in the substrate in the pixel area; covering a surface of the substrate in the pixel area with a buffer dielectric layer so that the buffer dielectric layer buries the trench fill structure beneath; etching the buffer dielectric layer to form a first opening, in which at least a portion of the substrate surrounding a top edge of the trench fill structure and/or at least part of a top of the trench fill structure is/are exposed; and forming a metal grid layer on the buffer dielectric layer so that the metal grid layer fills the first opening and is electrically connected to the exposed portion(s) of the substrate and/or the trench fill structure. With this method, the metal grid layer is brought into electrical connection with the exposed portion(s) of the substrate and/or the trench fill structure, thus allowing the optimization or amelioration of the semiconductor device's electrical performance.

In an embodiment of the present invention, there is provided a semiconductor device including a substrate, a trench fill structure, a buffer dielectric layer and a metal grid layer. The substrate defines a pixel area, and the trench fill structure is formed in the substrate in the pixel area. The buffer dielectric layer is formed on a surface of the substrate in the pixel area. In the buffer dielectric layer, there is formed a first opening, in which at least a portion of the substrate surrounding a top edge of the trench fill structure and/or at least part of a top of the trench fill structure is/are exposed. The metal grid layer is formed on the buffer dielectric layer so that it fills the first opening and is electrically connected to the exposed portion(s) of the substrate and/or the trench fill structure.

The semiconductor device will be described in greater detail below with reference to FIGS. 3*i*, 4*e*, 5*e*, 6 and 7*i*.

The pixel area 21 is defined in the substrate 20. The substrate 20 may be formed of any suitable material well known to those skilled in the art. Reference can be made to the above description given in connection with step S11, and a repeated description thereof will be omitted here.

The trench fill structure 212 is formed in the substrate 20 in the pixel area 21. The trench fill structure 212 includes an isolation oxide layer 2121 covering a surface of a trench 211 in the substrate 20 and a filler material that fills the trench 211. The isolation oxide layer 2121 is at least present between a sidewall of the filler material and the substrate 20. That is, the isolation oxide layer 2121 may covers either only the trench's side surface 211 or both the trench's side and bottom surface. The trench 211 may be a deep trench with a depth ranging from 1 μm to 5 μm. It is to be noted that the trench 211 is not limited to the listed range and the trench 211 may have any suitable depth as required by the intended performance of the semiconductor device.

The filler material may include a dielectric material, or a metallic material, or both. In case of the filler material being implemented as a metallic material, the trench fill structure 212 includes the isolation oxide layer 2121 covering the surface(s) of the trench 211 and a first conductive metal layer 2122 filling the remaining space in the trench 211 (i.e., the filler material forms the first conductive metal layer 2122). The dielectric material may include at least one of silicon dioxide, silicon nitride, tetraethyl orthosilicate, borosilicate glass, phosphorosilicate glass, borophosphosilicate glass and silicon oxynitride, and the metallic material may include at least one of tungsten, nickel, aluminum, silver, gold and titanium.

A top surface of the trench fill structure 212 may be flush with a top surface of the substrate 20. Alternatively, a top surface of the trench fill structure 212 may be higher than a top surface of the substrate 20. Alternatively, in the trench fill structure 212, only a top surface of the filler material may be higher than the top surface of the substrate 20.

The buffer dielectric layer 25 is formed on the surface of the substrate 20 in the pixel area 21, and in the first opening formed in the buffer dielectric layer 25, at least a portion of the substrate 20 surrounding a top edge of the trench fill structure 212, or at least part of a top of the trench fill structure 212 is exposed, alternatively, both of the least a portion of the substrate 20 surrounding a top edge of the trench fill structure 212 and the at least part of a top of the trench fill structure 212 are exposed. The buffer dielectric layer 25 may be made of a material including at least one of silicon dioxide, silicon nitride, tetraethyl orthosilicate, borosilicate glass, phosphorosilicate glass, borophosphosilicate glass and silicon oxynitride.

Here, exposing at least a portion of the substrate 20 surrounding the top edge of the trench fill structure 212 in the first opening means that a sidewall of the first opening surrounds at least the top edge of the trench fill structure 212 so that a portion of the substrate 20 surrounding the top edge of the trench fill structure 212 is exposed in the first opening.

Example scenarios of exposing at least part of the top of the trench fill structure 212 in the first opening may include: in case of the top surface of the trench fill structure 212 being higher than the top surface of the substrate 20, with the sidewall of the first opening so surrounding the protruding upper portion of the trench fill structure 212 that the isolation oxide layer 2121 is exposed at a sidewall of the protruding upper portion, also exposing a portion of the substrate 20 surrounding the sidewall of the protruding upper portion in the first opening; in case of only the top surface of the filler material in the trench fill structure 212 being higher than the top surface of the substrate 20, with the sidewall of the first opening surrounding the protruding upper portion of the trench fill structure 212, exposing the filler material at a sidewall of the protruding upper portion in the first opening; in case of the top surface of the trench fill structure 212 higher than or flush with the top surface of the substrate 20, with the first opening being seated on the top surface of the trench fill structure 212, exposing the entire or part of the top surface of the trench fill structure 212 in the first opening, including exposing the entire or part of the top surface of the filler material and/or the entire or part of a top surface of the isolation oxide layer 2121 in the first opening; and in case of the top surface of the trench fill structure 212 higher than the top surface of the substrate 20, exposing both the isolation oxide layer 2121 or filler material at the sidewall of the protruding upper portion of the trench fill structure 212 and the entire or part of the top surface of the trench fill structure 212 in the first opening.

When the filler material includes the first conductive metal layer 2122, example scenarios of exposing at least part of the top of the trench fill structure 212 in the first opening may include: with the sidewall of the first opening surrounding the top edge of the trench fill structure 212, exposing the first conductive metal layer 2122 at the sidewall of the protruding upper portion of the trench fill structure 212 in the first opening; Alternatively, with the first opening being seated on the top surface of the trench fill structure 212, exposing the entire or part of a top surface of the first conductive metal layer 2122 in the trench fill structure 212 in the first opening. Alternatively, exposing both the first conductive metal layer 2122 at the sidewall of the protruding upper portion of the trench fill structure 212 and the entire or part of the top surface of the first conductive metal layer 2122 in the trench fill structure 212 in the first opening.

The metal grid layer is so formed on the buffer dielectric layer 25 that it fills the first opening and is electrically connected to either the exposed portions of the substrate 20 or the trench fill structure 212, alternatively, electrically connected to both of the exposed portions of the substrate 20 and the trench fill structure 212. Electrically connecting the metal grid layer to the exposed portion(s) of the substrate 20 and/or trench fill structure 212 allows optimization or amelioration of the semiconductor device's electrical performance, such as its dark current performance.

When only the substrate 20 is partially exposed in the first opening, the metal grid layer is electrically connected to only the exposed portion of the substrate 20. When the top of the trench fill structure 212 is at least partially exposed in the first opening, the various example scenarios described above in connection may correspond to electrically connecting the metal grid layer respectively to the underlying: exposed portion of the substrate 20, when the top surface of the trench fill structure 212 is higher than the top surface of the substrate 20, with the sidewall of the first opening surrounding the protruding upper portion of the trench fill structure 212 (so that the isolation oxide layer 2121 is exposed at the sidewall of the protruding upper portion); first conductive metal layer 2122 exposed at the sidewall of the protruding upper portion of the trench fill structure 212, when only the top surface of the filler material in the trench fill structure 212, which is implemented as the first conductive metal layer 2122, is higher than the top surface of the substrate 20, with the sidewall of the first opening surrounding the protruding upper portion of the trench fill structure 212; entirely or partially exposed top surface of the first conductive metal layer 2122 in the trench fill structure 212, when the top surface of the trench fill structure 212 is higher than or flush with the top surface of the substrate 20, with the first opening being seated on the top surface of the filler material in the trench fill structure 212, which is implemented as the first conductive metal layer 2122; and both portion of the substrate 20 and first conductive metal layer 2122, when the top surface of the trench fill structure 212 is higher than the top surface of the substrate 20, with both the isolation oxide layer 2121 or first conductive metal layer 2122 at the sidewall of the protruding upper portion of the trench fill structure 212 and the entire or part of the top surface of the first conductive metal layer 2122 being exposed in the first opening.

Examples of electrically connecting the metal grid layer to the exposed portion(s) of the substrate 20 and/or the trench fill structure 212 may include: electrically connecting the metal grid layer 214 to a portion of the substrate 20 surrounding the top edge of the trench fill structure 212 and the entire top surface of the trench fill structure 212 that are both exposed in the first opening, as shown in FIG. 3*i*; electrically connecting the metal grid layer 215 to part of the top surface of the first conductive metal layer 2122 in the trench fill structure 212 that is exposed in the first opening, as shown in FIG. 4*e*; electrically connecting the metal grid layer 216 to a portion of the substrate 20 surrounding the top edge of the trench fill structure 212 that is exposed in the first opening, as shown in FIG. 5*e*; and electrically connecting the metal grid layer 217 to a portion of the substrate 20 surrounding the top edge of the trench fill structure 212 and part of the top surface of the first conductive metal layer 2122 in the trench fill structure 212 that are both exposed in the first opening, as shown in FIG. 6.

The substrate may further define a pad area located laterally to the pixel area, in which there are formed a metal interconnect structure and a plug structure above the metal interconnect structure. The plug structure may be electrically connected at the bottom to the metal interconnect structure and at the top to an overlying pad structure. It is to be noted that, than the metal interconnect structure, any other suitable metal structure electrically connected to the bottom of the plug structure may be formed in the substrate in the pad area. For example, such a metal structure may be a conductive contact plug electrically connected the bottom of the plug structure. The following description will be given in the context of the metal structure being implemented as a metal interconnect structure.

Since the plug structure contains a metallic material, the trench fill structure in the pixel area must be separately fabricated from the plug structure in the pad area if the filler material in the trench fill structure is a dielectric material. Otherwise, if the filler material in the trench fill structure is a metallic material, the trench fill structure in the pixel area may be fabricated either separately from or simultaneously with the plug structure in the pad area.

When the trench fill structure in the pixel area is fabricated separately from the plug structure in the pad area, the metallic material in the plug structure may be a conductive metal layer different from the first conductive metal layer in the trench fill structure. When the trench fill structure in the pixel area is fabricated simultaneously with the plug structure in the pad area, the metallic material in the plug structure will be provided by the first conductive metal layer in the trench fill structure.

Since the plug structure is electrically connected at the bottom to the metal interconnect structure, if there is another isolation oxide layer in the plug structure, this isolation oxide layer can only cover a sidewall of a through-hole in which part of a top surface of the metal interconnect structure is exposed. When the isolation oxide layer in the plug structure is made of the same material as the isolation oxide layer in the trench fill structure and the latter covers only the side surface of the trench in the pixel area, the trench fill structure in the pixel area may be fabricated simultaneously with the plug structure in the pad area. When the isolation oxide layer in the plug structure is made of the same material as the isolation oxide layer in the trench fill structure and the latter covers both the side and bottom surfaces of the trench in the pixel area, simultaneous fabrication of the trench fill structure in the pixel area and the plug structure in the pad area requires additional step of removing a further isolation oxide layer on a bottom surface of the through-hole. When the isolation oxide layer in the plug structure is made of a different material from the isolation oxide layer in the trench fill structure, the trench fill structure in the pixel area must be separately fabricated from the plug structure in the pad area.

When the trench fill structure in the pixel area can be fabricated simultaneously with the plug structure in the pad area, the metal grid layer in the pixel area and the pad structure in the pad area can also be fabricated simultaneously.

As can be seen from the process described above in connection with FIGS. 1*a* to 1*j*, fabricating the metal grid layer in the pixel area and the pad structure in the pad area in separate steps can lead to high process complexity and low process integration and thus to high process cost. Therefore, fabricating the trench fill structure and metal grid layer in the pixel area simultaneously with the plug structure and pad structure in the pad area can lower process complexity and increase process integration, thus resulting in a reduction in process cost.

Reference can be made to the above description for details in the other scenarios of electrical connection of the metal grid layer in the pixel area with the exposed portion(s) of the substrate and/or the trench fill structure, and a repeated description thereof will be omitted. How the trench fill structure 212 and the metal grid layer 214 in the pixel area 21 are fabricated simultaneously with the plug structure 223 and the pad structure 225 in the pad area 22 will be explained below in the context of the metal grid layer 214 being electrically connected to both a portion of the substrate 20 surrounding the top edge of the trench fill structure 212 and the entire top surface of the trench fill structure 212 that are both exposed in the first opening 2131, as shown in FIG. 7*i*, as an example.

When the trench fill structure 212 includes the isolation oxide layer covering the surface(s) of the trench 211 in the pixel area 21 and the first conductive metal layer that fills the remaining space of the trench 211, the plug structure 223 includes another portion of the isolation oxide layer covering a sidewall of a through-hole 222, in which part of a top surface of the metal interconnect structure 221 is exposed, and another portion of the first conductive metal layer that fills the through-hole 222. For the sake of distinction, the isolation oxide layer portion in the trench 211 is referred to as the "isolation oxide layer 2121" and that in the through-hole 222 as the "isolation oxide layer 2231" hereinafter, and these portions are indicated by different filling patterns in FIG. 7*c*. In addition, the first conductive metal layer portion in the trench 211 is referred to as the "first conductive metal layer 2122" and that in the through-hole 222 as the "first conductive metal layer 2232", and these portions are again indicated by different filling patterns in FIG. 7*c*. The isolation oxide layer 2121 in the trench 211 can cover either only a side surface of the trench 211 or both the trench 211's side and bottom surfaces, while the isolation oxide layer 2231 in the through-hole 222 only covers the through-hole 222's sidewall. The first conductive metal layer 2232 in the plug structure 223 is electrically connected at the bottom to the metal interconnect structure 221.

Additionally, the buffer dielectric layer 25 formed on the surface of the substrate 20 in the pixel area 21 also extends over a surface of the of the substrate 20 in the pad area 22, and in addition to the first opening 2131 formed in the buffer dielectric layer 25 above the pixel area 21, a second opening 224 is also formed in the buffer dielectric layer 25 above the pad area 22. In the first opening 2131, both a portion of the substrate 20 surrounding the top edge of the trench fill structure 212 and the entire top surface of the trench fill structure 212 are exposed, while in the second opening 224, part of a top surface of the plug structure 223 is exposed. Specifically, the top surface of the first conductive metal layer 2232 in the plug structure 223 may be wholly or partially exposed in the second opening 224.

Further, in addition to the metal grid layer 214 formed on the buffer dielectric layer 25 above the pixel area 21, the pad structure 225 is also formed on the buffer dielectric layer 25 above the pad area 22. The metal grid layer 214 fills the first opening 2131 so as to be electrically connected to the exposed portions of the substrate 20 and the trench fill structure 212, while the pad structure 225 fills the second opening 224 so as to be electrically connected to the exposed top surface portion of the plug structure 223.

In summary, the present invention provides a semiconductor device, including: a substrate defining a pixel area; a trench fill structure formed in the substrate in the pixel area; a buffer dielectric layer formed on a surface of the substrate in the pixel area, the buffer dielectric layer defining a first opening in which at least a portion of the substrate surrounding a top edge of the trench fill structure and/or at least part of a top of the trench fill structure is/are exposed; and a metal grid layer formed on the buffer dielectric layer, the metal grid layer filling the first opening so as to be electrically connected the exposed portion(s) of the substrate and/or the trench fill structure. In this semiconductor device, the metal grid layer is bought into electrical connection with the exposed portion(s) of the substrate and/or the trench fill structure, thus allowing optimization or amelioration of the semiconductor device's electrical performance.

The description presented above is merely that of a few preferred embodiments of the present invention and does not limit the scope thereof in any sense. Any and all changes and modifications made by those of ordinary skill in the art based on the above teachings fall within the scope as defined in the appended claims.

What is claimed is:

1. A method of fabricating a semiconductor device, the method comprising:
- providing a substrate defining a pixel area;
- forming a trench fill structure in the substrate in the pixel area;
- covering a buffer dielectric layer over a surface of the substrate in the pixel area, the buffer dielectric layer burying the trench fill structure;
- etching the buffer dielectric layer to form a first opening, which exposes at least a portion of the substrate surrounding sidewalls of a top of the trench fill structure and/or at least a portion of the top of the trench fill structure; and
- forming a metal grid layer on the buffer dielectric layer, wherein the metal grid layer fills the first opening and is electrically connected to the exposed portion of the substrate and/or the exposed portion of the trench fill structure,
- wherein the substrate further defines a pad area lateral to the pixel area, and wherein a metal interconnect structure and a plug structure above the metal interconnect structure are formed in the substrate in the pad area, the plug structure electrically connected at a bottom thereof to the metal interconnect structure, and
- wherein the trench fill structure comprises a first conductive metal layer in a trench formed in the pixel area, and the plug structure in the substrate in the pad area is formed simultaneously with the trench fill structure in the substrate in the pixel area.

2. The method of fabricating a semiconductor device of claim 1, wherein forming a trench fill structure in the substrate in the pixel area comprises:

covering a pad oxide layer over the surface of the substrate in the pixel area;

forming a first patterned photoresist layer on the pad oxide layer and etching the pad oxide layer and at least a partial thickness of the substrate with the first patterned photoresist layer serving as a mask, thereby forming a trench in the substrate in the pixel area;

removing the first patterned photoresist layer;

forming an isolation oxide layer over a surface of the trench and a surface of the pad oxide layer;

completely filling the trench with a filler material, which also covers the isolation oxide layer outside the trench; and removing a portion of the filler material, the isolation oxide layer and the pad oxide layer on the surface of the substrate outside the trench by performing an etching or chemical mechanical polishing (CMP) process, thereby forming the trench fill structure in the trench.

3. The method of fabricating a semiconductor device of claim 2, wherein the filler material comprises a first conductive metal layer, and wherein the first opening exposing at least a portion of a top of the trench fill structure comprises: the first opening surrounding sidewalls of the top of the trench fill structure and exposing the first conductive metal layer on the sidewalls of the top of the trench fill structure in the first opening; and/or, the first opening being located on a top surface of the trench fill structure and exposing an entire or a portion of a top surface of the first conductive metal layer of the trench fill structure in the first opening.

4. The method of fabricating a semiconductor device of claim 1, wherein etching the buffer dielectric layer to form a first opening comprises:

forming a second patterned photoresist layer on the buffer dielectric layer and etching the buffer dielectric layer with the second patterned photoresist layer serving as a mask, thereby forming the first opening in the buffer dielectric layer above the pixel area, the first opening exposing at least a portion of the substrate surrounding the sidewalls of the top of the trench fill structure and/or at least a portion of the top of the trench fill structure; and removing the second patterned photoresist layer.

5. The method of fabricating a semiconductor device of claim 1, wherein forming the metal grid layer on the buffer dielectric layer comprises:

forming a second conductive metal layer to cover the buffer dielectric layer, the second conductive metal layer completely filling the first opening;

forming a third patterned photoresist layer on the second conductive metal layer and etching the second conductive metal layer with the third patterned photoresist layer serving as a mask, thereby forming the metal grid layer above the pixel area, the metal grid layer electrically connected to the portion of the substrate and/or the portion of the trench fill structure exposed in the first opening; and removing the third patterned photoresist layer.

6. The method of fabricating a semiconductor device of claim 1, wherein the buffer dielectric layer covering the surface of the substrate in the pixel area further covers a surface of the substrate in the pad area so that the buffer dielectric layer also buries the plug structure, wherein forming the first opening by etching the buffer dielectric layer above the pixel area is performed simultaneously with etch the buffer dielectric layer above the pad area to form a second opening in which a top surface of the plug structure is partially exposed; and wherein forming the metal grid layer on the buffer dielectric layer in the pixel area is performed simultaneously with forming a pad structure on the buffer dielectric layer in the pad area, the pad structure completely filling the second opening so as to be electrically connected to the exposed portion of the top surface of the plug structure.

7. The method of fabricating a semiconductor device of claim 1, wherein the metal grid layer is in electrical connected to the exposed portion of the substrate and/or part of the top of the trench fill structure to apply a bias voltage to a backside of the substrate.

8. A method of fabricating a semiconductor device, the method comprising:

providing a substrate defining a pixel area;

forming a trench fill structure in the substrate in the pixel area;

covering a buffer dielectric layer over a surface of the substrate in the pixel area, the buffer dielectric layer burying the trench fill structure;

etching the buffer dielectric layer to form a first opening, which at least exposes a portion of the substrate surrounding a top surface of the trench fill structure; and forming a metal grid layer on the buffer dielectric layer, wherein the metal grid layer fills the first opening to at least directly contact with and electrically connect to the exposed portion of the substrate, wherein the substrate further defines a pad area lateral to the pixel area, and wherein a metal interconnect structure and a plug structure above the metal interconnect structure are formed in the substrate in the pad area, the plug structure electrically connected at a bottom thereof to the metal interconnect structure, and wherein the trench fill structure comprises a first conductive metal layer in a trench formed in the pixel area, and the plug structure in the substrate in the pad area is formed simultaneously with the trench fill structure in the substrate in the pixel area.

9. The method of fabricating a semiconductor device of claim 8, wherein the formation of the first opening comprises: forming a second patterned photoresist layer on the buffer dielectric layer; and etching the buffer dielectric layer with the second patterned photoresist layer serving as a mask so that the first opening is formed in the buffer dielectric layer above the pixel area, both a portion of the substrate surrounding a top edge of the trench fill structure and an entire top surface of the trench fill structure are exposed in the first opening.

10. The method of fabricating a semiconductor device of claim 8, wherein the formation of the first opening comprises: forming a second patterned photoresist layer on the buffer dielectric layer; and etching the buffer dielectric layer with the second patterned photoresist layer serving as a mask so that the first opening is formed in the buffer dielectric layer above the pixel area, part of the top surface of the trench fill structure is exposed in the first opening.

11. The method of fabricating a semiconductor device of claim 8, wherein the formation of the first opening comprises: forming a second patterned photoresist layer on the buffer dielectric layer; and etching the buffer dielectric layer with the second patterned photoresist layer serving as a mask so that the first opening is formed in the buffer dielectric layer above the pixel area, a portion of the substrate surrounding a top edge of the trench fill structure is exposed in the first opening.

12. The method of fabricating a semiconductor device of claim 8, wherein the metal grid layer is in direct contact with and electrically connected to the exposed portion of the substrate to apply a bias voltage to a backside of the substrate.

13. The method of fabricating a semiconductor device of claim 8, wherein forming a trench fill structure in the substrate in the pixel area comprises:

covering a pad oxide layer over the surface of the substrate in the pixel area;

forming a first patterned photoresist layer on the pad oxide layer and etching the pad oxide layer and at least a partial thickness of the substrate with the first patterned photoresist layer serving as a mask, thereby forming a trench in the substrate in the pixel area;

removing the first patterned photoresist layer;

forming an isolation oxide layer over a surface of the trench and a surface of the pad oxide layer;

completely filling the trench with a filler material, which also covers the isolation oxide layer outside the trench; and removing a portion of the filler material, the isolation oxide layer and the pad oxide layer on the surface of the substrate outside the trench by performing an etching or chemical mechanical polishing (CMP) process, thereby forming the trench fill structure in the trench.

14. The method of fabricating a semiconductor device of claim 8, wherein forming the metal grid layer on the buffer dielectric layer comprises:

forming a second conductive metal layer to cover the buffer dielectric layer, the second conductive metal layer completely filling the first opening;

forming a third patterned photoresist layer on the second conductive metal layer and etching the second conductive metal layer with the third patterned photoresist layer serving as a mask, thereby forming the metal grid layer above the pixel area, the metal grid layer at least being directly contact with and electrically connect to the exposed portion of the substrate; and removing the third patterned photoresist layer.

15. The method of fabricating a semiconductor device of claim 8, wherein the buffer dielectric layer covering the surface of the substrate in the pixel area further covers a surface of the substrate in the pad area so that the buffer dielectric layer also buries the plug structure, wherein forming the first opening by etching the buffer dielectric layer above the pixel area is performed simultaneously with etch the buffer dielectric layer above the pad area to form a second opening in which a top surface of the plug structure is partially exposed; and wherein forming the metal grid layer on the buffer dielectric layer in the pixel area is performed simultaneously with forming a pad structure on the buffer dielectric layer in the pad area, the pad structure completely filling the second opening so as to be electrically connected to the exposed portion of the top surface of the plug structure.

* * * * *